(12) United States Patent
Abe et al.

(10) Patent No.: US 7,737,001 B2
(45) Date of Patent: Jun. 15, 2010

(54) SEMICONDUCTOR MANUFACTURING METHOD

(75) Inventors: Yoshiyuki Abe, Tokyo (JP); Chuichi Miyazaki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 494 days.

(21) Appl. No.: 11/444,507

(22) Filed: Jun. 1, 2006

(65) Prior Publication Data
US 2007/0066044 A1    Mar. 22, 2007

(30) Foreign Application Priority Data
Jun. 1, 2005  (JP) .............................. 2005-161803

(51) Int. Cl.
  *H01L 21/00*  (2006.01)
(52) U.S. Cl. ..................... 438/462; 438/463; 438/464
(58) Field of Classification Search .......... 438/462–464
  See application file for complete search history.

(56) References Cited

U.S. PATENT DOCUMENTS

| | | | |
|---|---|---|---|
| 5,968,382 | A | 10/1999 | Matsumoto et al. |
| 6,734,083 | B2 | 5/2004 | Kobayashi |
| 6,756,562 | B1 | 6/2004 | Kurosawa et al. |
| 6,992,026 | B2 | 1/2006 | Fukuyo et al. |
| 7,141,443 | B2 * | 11/2006 | Nagai et al. .................... 438/33 |
| 2004/0145028 | A1 * | 7/2004 | Matsumoto et al. ......... 257/620 |
| 2004/0164061 | A1 | 8/2004 | Takeuchi et al. |
| 2004/0224483 | A1 | 11/2004 | Takyu et al. |
| 2005/0006361 | A1 | 1/2005 | Kobayashi et al. |
| 2005/0023260 | A1 * | 2/2005 | Takyu et al. ........... 219/121.67 |
| 2005/0110151 | A1 * | 5/2005 | Tamura et al. ............. 257/759 |
| 2005/0202596 | A1 | 9/2005 | Fukuyo et al. |
| 2006/0128065 | A1 * | 6/2006 | Inada et al. .................. 438/118 |

FOREIGN PATENT DOCUMENTS

| | | |
|---|---|---|
| JP | 7-256479 | 10/1995 |
| JP | 09-029472 | 2/1997 |
| JP | 2003-151924 | 5/2003 |
| JP | 2003-173988 | 6/2003 |
| JP | 2003-320466 | 11/2003 |

(Continued)

OTHER PUBLICATIONS

Chinese Official Action dated Apr. 24, 2009, for Application No. 200610085089.1.

*Primary Examiner*—Kevin M Picardat
*Assistant Examiner*—Bac H Au
(74) *Attorney, Agent, or Firm*—Antonelli, Terry, Stout & Kraus, LLP.

(57) ABSTRACT

In a stealth dicing process for a semiconductor device with a low dielectric constant layer, the occurrence of poor appearance such as a defective shape or discoloration in the layer is reduced or prevented as follows. A low dielectric constant layer is formed in an interlayer insulating layer formed on the main surface of a semiconductor wafer. A laser beam is focused on the inside of the wafer from the reverse side of the wafer in order to form modified regions selectively. Each modified region is formed in a way to contact, or partially get into, the low dielectric constant layer. In this formation process, the semiconductor wafer is cooled by a cooling element. This reduces or prevents discoloration of the low dielectric constant layer which might occur due to the heat of a laser beam.

9 Claims, 20 Drawing Sheets

FOREIGN PATENT DOCUMENTS

| | | |
|---|---|---|
| JP | 2004-001076 | 1/2004 |
| JP | 2004-25187 | 1/2004 |
| JP | 2004-186635 | 7/2004 |
| JP | 2004-235626 | 8/2004 |
| JP | 2004-282037 | 10/2004 |
| JP | 2005-028438 | 2/2005 |
| JP | 2005-047290 | 2/2005 |
| JP | 2005-57257 | 3/2005 |

* cited by examiner

SEMICONDUCTOR MANUFACTURING METHOD

CROSS-REFERENCE TO RELATED APPLICATION

The present application claims priority from Japanese patent application No. 2005-161803 filed on Jun. 1, 2005, the content of which is hereby incorporated by reference into this application.

BACKGROUND OF THE INVENTION

The present invention relates to semiconductor device manufacturing technology and more particularly to technology which is useful for the Stealth Dicing technology.

The Stealth Dicing technology is a technology whereby the inside of a semiconductor wafer is irradiated with a laser beam to create a modified layer selectively and the semiconductor wafer is cut with the modified layer as the splitting start point. According to this technology, even a very thin semiconductor wafer with a thickness of about 30 micrometers is directly cut without causing physical stress, chipping is reduced and the deflecting strength of each semiconductor chip is increased, resulting in improvement in semiconductor device yield and reliability. In addition, since high speed dicing at a rate of 300 mm/s or more can be done regardless of the semiconductor wafer thickness, throughput is improved.

This stealth dicing technology is referred to, for example, in Japanese Unexamined Patent Publication No. 2004-235626. Disclosed in paragraphs 0048 to 0053 and FIGS. 19 and 20 of the document is a laser dicing technique whereby the reverse side of a wafer is irradiated with a laser beam to create a modified layer for dicing. In this method, the front side of the wafer is held in a cooling bath or on a cooling chuck which uses a Peltier device, in order to prevent rise in the temperature of the wafer.

Furthermore, Japanese Unexamined Patent Publication No. 2005-57257 (paragraph 0087 and FIGS. 13 and 14), Japanese Unexamined Patent Publication No. 2005-47290 (paragraph 0040 and FIG. 16), and Japanese Unexamined Patent Publication No. 2004-1076 (paragraphs 0075 and 0076 and FIG. 23) disclose a technique whereby the reverse side of a wafer is irradiated with laser light focused on several points in the wafer thickness direction.

Moreover, Japanese Unexamined Patent Publication No. 2005-28438 (paragraph 0022 and FIG. 3) discloses a technique whereby plural modified layers are formed inside a wafer in its depth direction and a laser beam is split by a splitter to make laser irradiation with laser light focused on points of different depths at a time. Also, Japanese Unexamined Patent Publication No. 2003-173988 (paragraph 0011 and FIGS. 1 and 3) and Japanese Unexamined Patent Publication No. 2004-186635 (paragraph 0057 and FIG. 5) disclose a technique whereby, when the front side of a wafer is irradiated with a laser beam to melt the wafer for dicing, the laser beam passes through a water jet to guide the beam and cool cutting regions to prevent thermal deterioration.

Furthermore, Japanese Unexamined Patent Publication No. 2004-282037 (paragraphs 0035, 0036 and 0049 and FIG. 2) discloses a technique whereby after half-dicing the upper surface of a wafer, a laser beam is cast on the diced regions to fuse or evaporate cut streaks. In this laser irradiation process, the wafer is placed in a processing bath under water to prevent rise in the temperature of the wafer.

Also, Japanese Unexamined Patent Publication No. Hei 7 (1995)-256479 (paragraphs 0031 to 0034 and FIG. 1) discloses a dicing technique whereby a substrate is irradiated with a laser beam while it is placed in a processing bath under water, so that rise in the temperature of the substrate is prevented.

Furthermore, Japanese Unexamined Patent Publication No. 2004-25187 (paragraphs 0010 and 0011 and FIG. 1) discloses a technique whereby one side of a wafer is cooled by a Peltier device and the other side is irradiated with a laser beam for dicing.

Also, Japanese Unexamined Patent Publication No. Hei 9 (1997)-29472 (paragraphs 0027 to 0031 and FIGS. 1 and 2) discloses a technique whereby a splitting start point of a substrate is cooled by a Peltier device and a laser beam is irradiated from the other side to form an initial crack for splitting. In paragraphs 0022 to 0025 and FIG. 1 of the same document, a technique for improving the finish of the chip is disclosed whereby a wiring layer is formed to absorb the laser light in diced regions of a wafer with a low-k film formed thereon.

Furthermore, Japanese Unexamined Patent Publication No. 2003-320466 (paragraphs 0007 and 0008) discloses a technique whereby a low dielectric constant film on a silicon wafer is removed with a laser beam before the wafer is diced. Also, Japanese Unexamined Patent Publication No. 2003-151924 (paragraphs 0027 to 0029 and FIGS. 1 to 3) discloses a technique whereby while a slit is being made in one side of a wafer with a blade, at the same time a laser beam passed through the water reaches the other side of the wafer to dice the wafer.

SUMMARY OF THE INVENTION

The present inventors found the following problem of the stealth dicing process for semiconductor devices having a low dielectric constant film (low-k film) in a wiring layer.

When a wafer is divided into separate chips, it may happen that the low dielectric constant film is cut improperly and the problem of poor appearance arises in the cracks of the low dielectric constant film. As a solution, a modified layer is formed in the wafer with a laser beam and at the same time a splitting start point is formed in the low dielectric constant film. However, although this method makes it possible to cut the low dielectric constant film neatly, the inventors found the following problem for the first time: discoloration of the film may be caused by the heat of laser light.

An object of the present invention is to provide a technique which reduces or prevents poor appearance of cracks of a low dielectric constant layer such as a defective shape or discoloration in the stealth dicing process for semiconductor devices with a low dielectric constant layer.

The above and further objects and novel features of the invention will more fully appear from the following detailed description in this specification and the accompanying drawings.

Preferred embodiments of the invention disclosed here are briefly outlined below.

According to one aspect of the invention, a wafer is cooled when a modified region is formed as a splitting start point in a later wafer cutting step for the wafer and a low dielectric constant layer formed in the wiring layer of the wafer main surface, by focusing a laser beam on the inside of the wafer from the reverse side of the wafer along a cutting region for each chip of the wafer.

According to another aspect of the invention, the stealth dicing process includes a step of forming a modified region in a wafer by irradiating a laser beam from the reverse surface of the wafer, and a step of making a slit in the low dielectric constant layer in the wiring layer on the wafer main surface side from the main surface of the wafer.

The effect brought about by preferred embodiments of the present invention is briefly described below.

Since a wafer is cooled when a modified region is formed as a splitting start point in a later wafer cutting step for the wafer and a low dielectric constant layer formed in the wiring layer of the wafer main surface, by focusing a laser beam on the inside of the wafer from the reverse side of the wafer along a cutting region for each chip of the wafer, the occurrence of poor appearance of the cracks of the low dielectric constant layer such as a defective shape or discoloration is reduced or prevented.

BRIEF DESCRIPTION OF THE DRAWINGS

The invention will be more particularly described with reference to the accompanying drawings, in which.

DETAILED DESCRIPTION OF THE PREFERRED EMBODIMENTS

Figure 1:
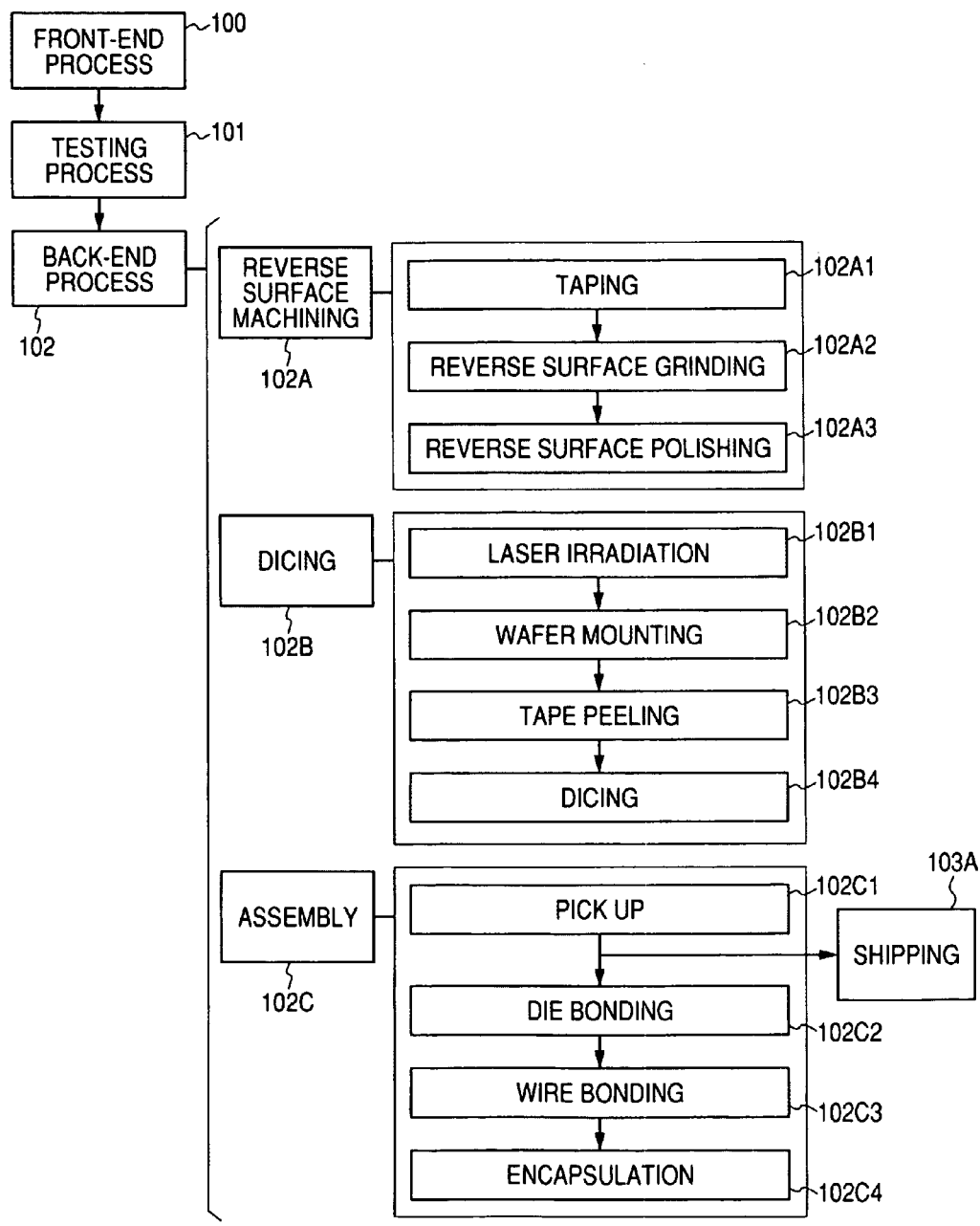
FIG. 1 is a flowchart of a semiconductor device manufacturing process according to a first embodiment of the invention.

The preferred embodiments described below will be described separately as necessary, but they are not irrelevant to each other unless otherwise specified. They are, in whole or in part, variations of each other and sometimes one description is a detailed or supplementary form of another. Also, in the preferred embodiments described below, even when the numerical datum for an element (the number of pieces, numerical value, quantity, range, etc.) is indicated by a specific numerical figure, it is not limited to the indicated specific numerical figure unless otherwise specified or theoretically limited to the specific numerical figure; it may be larger or smaller than the specific numerical figure. In the preferred embodiments described below, it is needles to say that their constituent elements (including constituent steps) are not necessarily essential unless otherwise specified or theoretically essential. Similarly, in the preferred embodiments described below, when specific forms, positions or other factors are indicated for certain elements, they should be interpreted to include forms, positions or other factors which are virtually equivalent or similar to the specific ones unless otherwise specified or unless only the specific ones should be used from a theoretical viewpoint. The same can be said of numerical values or ranges as mentioned above. In all the drawings that illustrate the preferred embodiments, elements with like functions are designated by like reference numerals and repeated descriptions of such elements are omitted except when necessary. Next, the preferred embodiments of the present invention will be described in detail referring to the accompanying drawings.

First Embodiment

The first embodiment will be described according to flowcharts in FIGS. 1 and 2 in reference to FIGS. 3 to 15.

In a front-end process 100, for instance, a semiconductor wafer (hereinafter called a wafer) with a diameter of 300 mm or so which is almost circular when viewed from above is first prepared. The wafer 1W has a main surface and a reverse surface which are opposite to each other in its thickness direction. Then, plural semiconductor chips (hereinafter called chips) are formed on the main surface of the wafer 1W. This front-end process 100, also called a wafer process, diffusion process or wafer fabrication, is a process of forming chips (devices and circuits) on the main surface of the wafer to prepare for electrical testing with a probe, etc. The front-end process includes a deposition step, an impurity doping step (diffusion or ion implantation), a photolithographic step, an etching step, a metallization step, a cleaning step and inspection steps between different steps.

Figure 3:
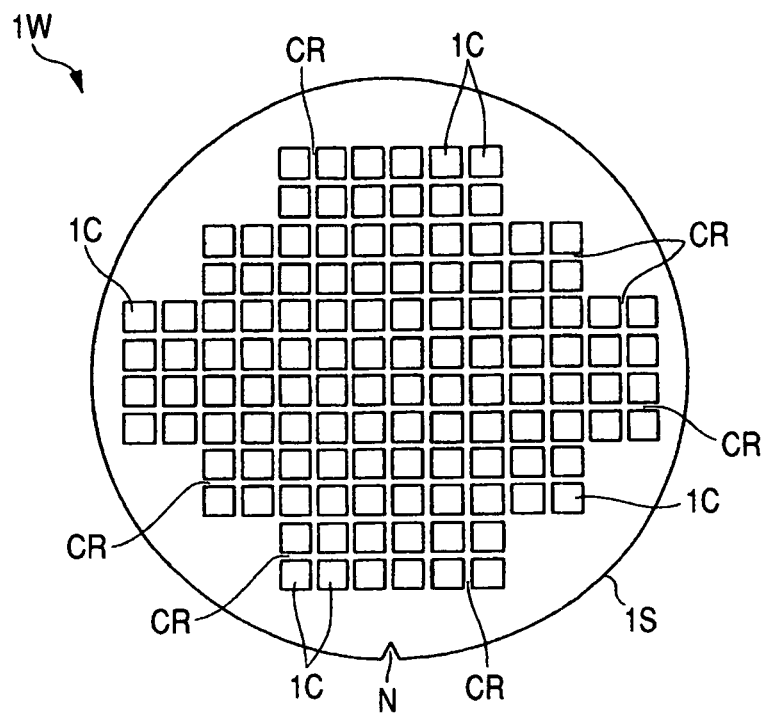
FIG. 3 is a general plan view of the main surface of a semiconductor wafer after the front-end process in FIG. 1.
Figure 4:
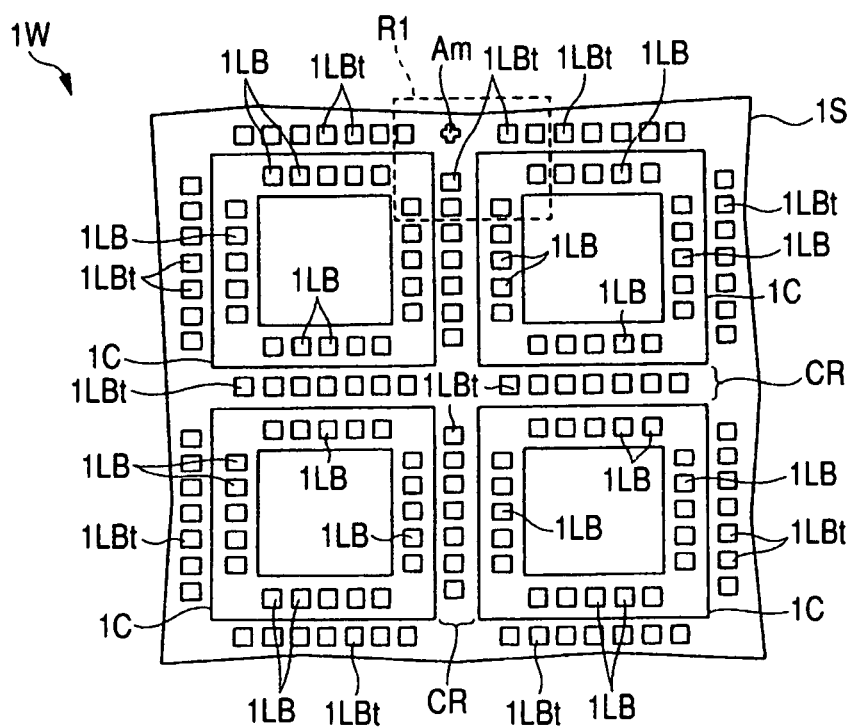
FIG. 4 is an enlarged plan view of a characteristic part of the semiconductor wafer in FIG. 3 as an example.
Figure 5:
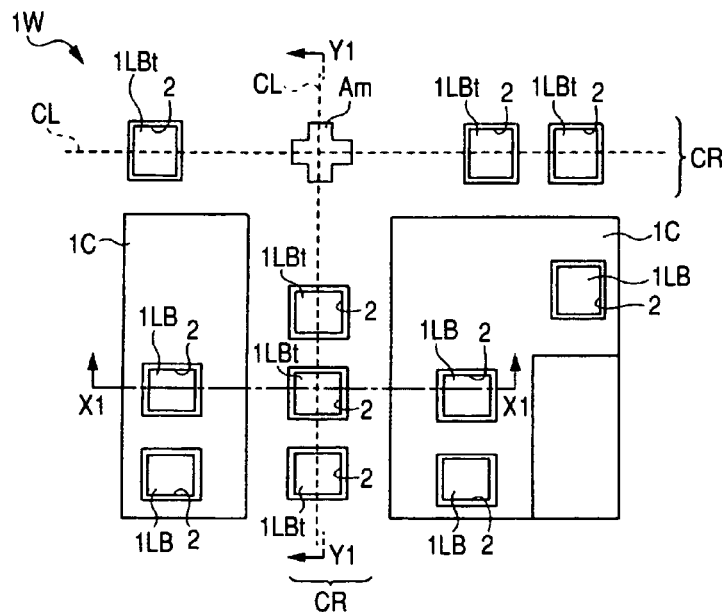
FIG. 5 is an enlarged plan view of a region R1 in FIG. 4.
Figure 6:
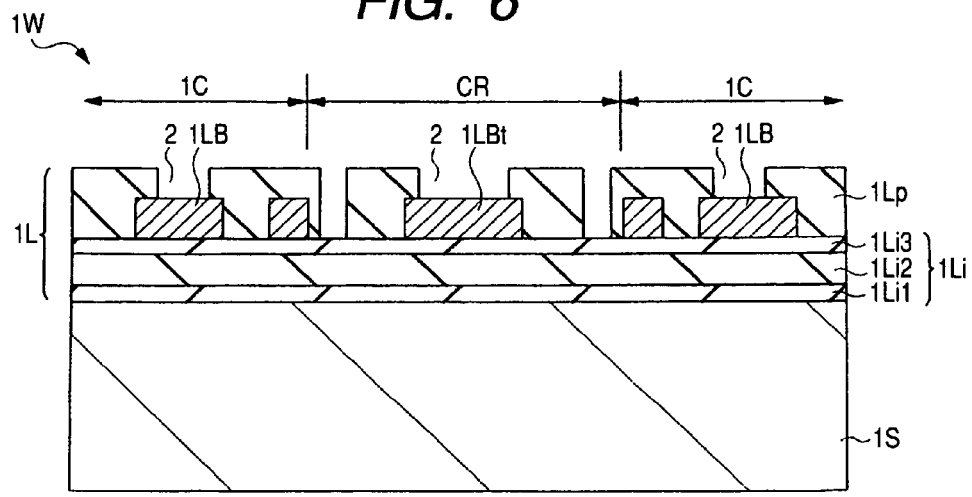
FIG. 6 is a sectional view taken along the line X1-X1 in FIG. 5.

FIG. 3 is a general plan view of the main surface of the wafer 1W after the front-end process 100; FIG. 4 is an enlarged plan view of a characteristic part of the wafer 1W in FIG. 3 as an example; FIG. 5 is an enlarged plan view of a region R1 in FIG. 4; and FIG. 6 is a sectional view taken along the line X1-X1 in FIG. 5. For example, plural square chips 1C (when viewed from above) are arranged on the main surface of the wafer 1W with cutting regions (splitting regions) CR around each chip. The semiconductor substrate 1S (hereinafter called the substrate) of the wafer 1W is made of monocrystal silicon (Si) and a device or wiring layer 1L is formed over its main surface. At this stage, the thickness of the wafer 1W (sum of substrate 1S thickness and wiring layer 1L thickness) is, for example, 775 micrometers or so. In FIG. 3, N represents a notch. In FIG. 5, CL represents a cutting line. The cutting line CL stretches almost along the center of the width (shorter side) of a cutting region CR.

The wiring layer 1L includes an interlayer insulating layer 1Li, wiring, bonding pads (external terminals, hereinafter called pads) 1LB, test (TEG, or Test Element Group) pads 1LBt, alignment targets Am and a surface protective layer (hereinafter called a protective layer) 1Lp.

The interlayer insulating layer 1Li has interlayer insulating layers 1Li1, 11i2 and 11i3. The interlayer insulating layers 1Li1 and 1Li3 consist of inorganic insulating film such as oxide silicon film ($SiO_2$, etc). The interlayer insulating layer 1Li2 consists of low dielectric constant film (low-k film) such as organic polymer or organic silica glass film.

Products available as this organic polymer (fully organic low dielectric interlayer insulating layer) are, for example, SiLK (made by The Dow Chemical Co. of the U.S.; relative dielectric constant=2.7, heat resistance=490° C. or more, dielectric breakdown voltage=4.0-5.0 MV/Vm) and FLARE as a polyarylether (PAE) material (made by Honeywell Electronic Materials of the U.S.; relative dielectric constant=2.8, heat resistance=400° C. or more). The PAE material provides high basic performance and features excellent mechanical strength and thermal stability and low cost.

Products available as the above organic silica glass (SiOC) include HSG-R7 (made by Hitachi Chemical Co., Ltd.; relative dielectric constant=2.8, heat resistance=650° C.), Black Diamond (made by Applied Materials, Inc.; relative dielectric constant=3.0-2.4, heat resistance=450° C.) and p-MTES (made by Hitachi Kaihatsu; relative dielectric constant=3.2). Other products available as the SiOC material are, for example, CORAL (made by Novellus Systems, Inc. of the U.S.; relative dielectric constant=2.7-2.4, heat resistance=500° C.) and Aurora 2.7 (made by ASM Japan K.K.; relative dielectric constant=2.7, heat resistance 450° C.).

Other available low dielectric constant layer materials include fully inorganic SiOF materials such as FSG, HSQ (hydrogen silsesquioxane) materials, MSQ (methyl silsesquioxane) materials, porous HSQ materials, porous MSQ materials and porous organic materials.

The above HSQ materials include OCD T-12 (made by Tokyo Ohka Kogyo Co., Ltd.; relative dielectric constant=3.4-2.9, heat resistance=450° C.), FOx (made by Dow Corning Corp. of the U.S.; relative dielectric constant=2.9) and OCL T-32 (made by Tokyo Ohka Kogyo Co., Ltd., relative dielectric constant=2.5, heat resistance=450° C.).

The above MSQ materials include OCD T-9 (made by Tokyo Ohka Kogyo Co., Ltd.; relative dielectric constant=2.7, heat resistance=600° C.), LKD-T200 (made by JSR; relative dielectric constant=2.7-2.5, heat resistance=450° C.), HOSP (made by Honeywell Electronic Materials; relative dielectric constant=2.5, heat resistance=550° C.), HSG-RZ25 (made by Hitachi Chemical Co., Ltd.; relative dielectric constant=2.5, heat resistance=650° C.), OCL T-31 (made by Tokyo Ohka Kogyo Co., Ltd.; relative dielectric constant=2.3, heat resistance=500° C.) and LKD-T400 (made by JSR; relative dielectric constant=2.2-2, heat resistance=450° C.)

The above HSQ materials include XLK (made by Dow Corning Corp.; relative dielectric constant=2.5-2), OCL T-72 (made by Tokyo Ohka Kogyo Co., Ltd.; relative dielectric constant 2.2-1.9, heat resistance=450° C.), Nanoglass (made by Honeywell Electronic Materials of the U.S.; relative dielectric constant=2.2-1.8, heat resistance=500° C. or more), and MesoELK (made by Air Products and Chemicals, Inc. of the U.S.; relative dielectric constant=2 or less).

The above porous MSQ materials include HSG-6211X (made by Hitachi Chemical Co., Ltd.; relative dielectric constant=2.4, heat resistance=650° C.), ALCAP-S (made by Asahi Chemical Industry Co., Ltd.; relative dielectric constant 2.3-1.8, heat resistance=450° C.), OCL T-77 (made by Tokyo Ohka Kogyo Co., Ltd.; relative dielectric constant=2.2-1.9, heat resistance=600° C.), HSG-6210X (made by Hitachi Chemical Co., Ltd.; relative dielectric constant=2.1, heat resistance=650° C.) and silica aerogel (made by Kobe Steel, Ltd.; relative dielectric constant=1.4-1.1).

The above porous organic materials include PolyELK (made by Air Products and Chemicals, Inc.; relative dielectric constant=2 or less, heat resistance=490° C.).

The above SiOC and SiOF materials are deposited, for example, by CVD (chemical vapor deposition). For example, Black Diamond is deposited by CVD using a mixed gas of trimethylsilane and oxygen or a similar process. p-MTES is deposited by CVD using a mixed gas of methyltriethoxysilane and $N_2O$ or a similar process. Other low dielectric constant insulating materials are deposited, for example, by coating.

Although the interlayer insulating layer 1Li2 is indicated as a single layer in FIG. 6 for simpler illustration, it is actually a laminate consisting of plural low dielectric constant layers. In these plural low dielectric constant layers, an insulating layer of silicon carbide (SiC), silicon carbonitride (SiCN) or the like lies between layers. A cap insulating layer of silicon oxide ($SiO_x$), typically silicon dioxide ($SiO_2$), may lie between the silicon carbide or silicon carbonitride insulating layer and the low dielectric constant layer. This cap insulating layer has such functions as to ensure the mechanical strength of the low dielectric constant layer in chemical mechanical polishing (CMP) and protect the surface and ensure moisture resistance. The cap insulating layer is thinner than the low dielectric constant layer. The material of the cap insulating layer is not limited to silicon oxide and may be another material: for example, silicon nitride ($Si_xN_y$), silicon carbide or silicon carbonitride. These silicon nitride, silicon carbide or silicon carbonitride layers may be formed by plasma CVD. One example of a material for a silicon carbide layer formed by plasma CVD is BLOk (made by AMAT; relative dielectric constant=4.3). In this formation process, a mixed gas of trimethylsilane and helium (or $N_2$, $NH_3$) is used.

For simpler illustration, FIG. 6 does not show wiring in the interlayer insulating layer 1Li2 but actually plural layers of wiring as mentioned above are formed in the interlayer insulating layer 1Li2. This wiring may be embedded. Specifically, the wiring is made by embedding a conductor layer in a wiring trench made in an insulating layer of the interlayer insulating layer 1Li2. The conductor layer which constitutes wiring has a main conductor layer and a barrier metal layer covering its outer surfaces (bottom and side surfaces). The main conductor layer is made of, for example, copper (Cu). The barrier metal layer is made of, for example, titanium nitride (TiN), tungsten nitride (WN), tantalum nitride (TaN), tantalum (Ta), titanium (Ti), tungsten (W) or titanium tungsten (TiW) or a laminate of these.

The wiring, pads 1LB, 1LBt and alignment target Am over the interlayer insulating layer 1Li3 are made of metal like aluminum. The wiring and pads 1LB, 1LBt, located in the upper most position, are covered by the protective layer 1Lp formed as the top layer of the wiring layer 1L. For example, the protective layer 1Lp is a laminate consisting of an insulating layer of inorganic material such as silicon oxide, an insulating layer of inorganic material such as silicon nitride deposited over it, and an insulating layer of organic material such as polyimide resin further deposited over it. Holes 2 are made in part of the protective layer 1Lp and the pads 1LB, 1LBt are partially exposed through the holes. The pads 1LB are arranged along the periphery of a chip 1C and electrically connected with an integrated circuit device of the chip 1C through the wiring.

The test pads 1LBt and alignment target Am are located in a cutting region CR of the chip 1C. For example, the test pads 1LBt are rectangular when viewed from above and electrically connected with a TEG element through the above wiring. The alignment target Am is a pattern used to align a chip 1C of the wafer 1W with a manufacturing device such as an exposure device and, for example, cruciform when viewed from above. Alternatively, the alignment target may be L-shaped or dot-shaped.

Next, in the testing process 101 in FIG. 1, various electric characteristic tests are carried out with a probe on pads 1LB of each chip 1C of the wafer 1W and test pads 1LBt in the cutting region CR. This testing process, also called a G/W (Good chip/Wafer) check process, is primarily intended to decide whether each chip 1C formed over the wafer 1W is good or not, through an electric method.

In the subsequent back-end process 102 in FIG. 1, the chip 1C is encapsulated in a package to finish it. The process includes a reverse surface machining stage 102A, a dicing stage 102B and an assembly stage 102C.

Figure 7:
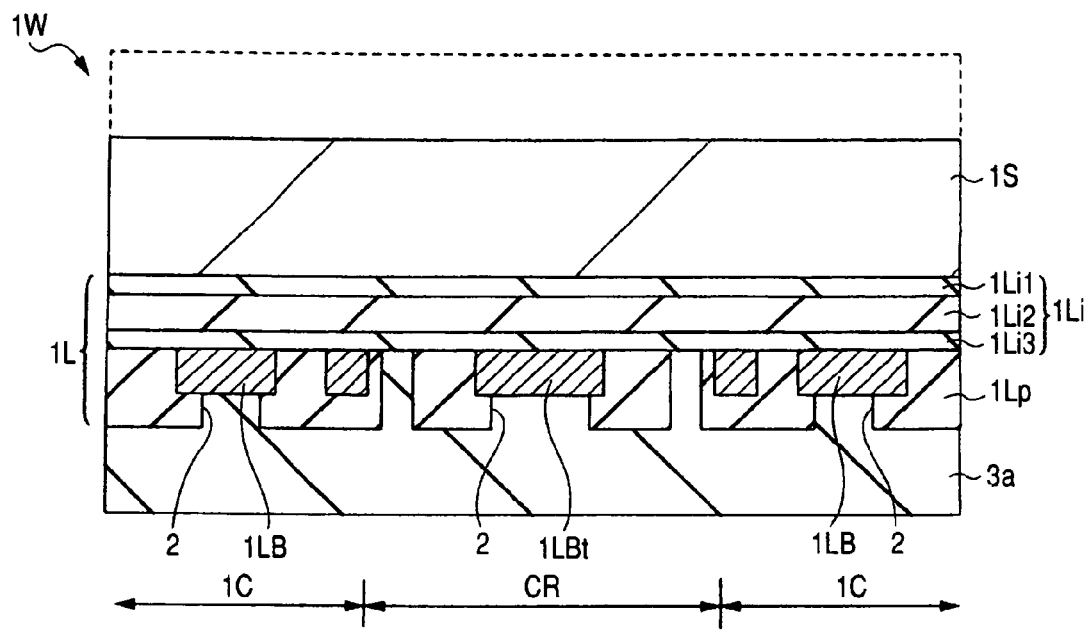
FIG. 7 is a sectional view of a characteristic part of the semiconductor wafer after the reverse surface machining step in FIG. 1.

First, in the reverse surface machining stage 102A, the main surface (chip formation surface) of the wafer 1 is taped (step 102A1), then the thickness of the wafer 1W is measured and the reverse surface of the wafer 1W is ground and polished by an adequate amount depending on the measured thickness (steps 102A, 102A3). FIG. 7 is a sectional view of a characteristic part of the wafer 1W after these steps: Tape 3a is firmly attached onto the main surface of the wafer 1W through its adhesive layer. It is desirable to use UV tape for the tape 3a. The UV tape should have an adhesive layer of UV curable resin and have a strong adhesive force. When it is irradiated with ultraviolet rays, the adhesive force of the adhesive layer quickly weakens.

The wafer 1W whose reverse surface has been ground and polished should be very thin (ultrathin), for example, 100 micrometers or less in (about 90 micrometers in this case). If the chip thickness is 100 micrometers or less, damage or stress to the reverse surface which has been caused by the reverse surface grinding step might deteriorate the chip's deflecting strength, making it more likely that the chip cracks due to the pressure applied to it during its mounting. As a solution to the above problem, the reverse surface polishing step is important in preventing damage or stress to the reverse surface of the wafer 1W. The reverse surface may be polished using a polishing pad and silica or by chemical mechanical polishing (CMP) or by an etching technique which uses, for example, nitric acid and fluorinated acid. If the thickness of the wafer 1W is larger than 150 micrometers, the reverse surface polishing step may be unnecessary in some cases. The broken line in FIG. 7 indicates the substrate 1S whose reverse surface has not been ground and polished yet.

Figure 8:
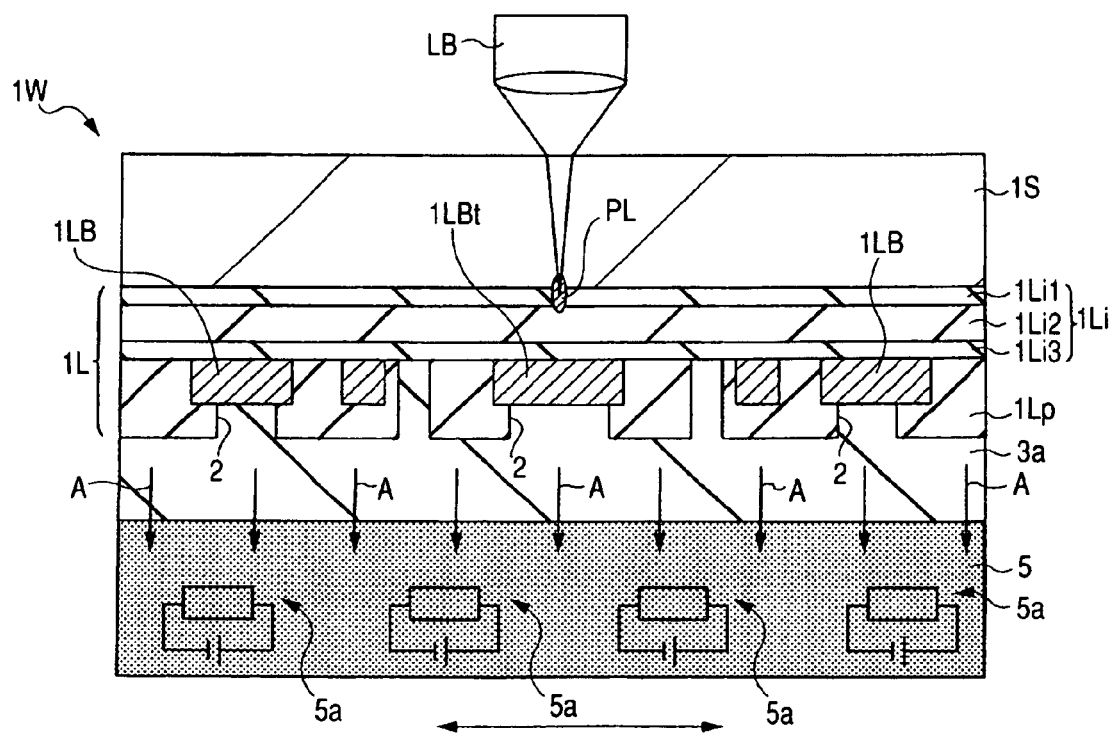
FIG. 8 is a sectional view of a characteristic part of the semiconductor wafer in the laser irradiation step in FIG. 1.

Next is a dicing stage 102B. Here, the very thin wafer 1W, with the tape 3a attached to its main surface, is first transported to a loader of a laser dicing apparatus and placed on a suction stage 5 of the laser dicing apparatus as shown in FIG. 8 (102B1-1 in FIG. 2). FIG. 8 is a sectional view of a characteristic part of the wafer 1W in the laser irradiation step. The suction stage 5 can temporarily fix the wafer 1W by vacuum contact and also cool the wafer 1W through a built-in cooling element 5a to a temperature lower than the room temperature, for example, −40 to 5° C. or so. The cooling element 5a may be, for example, a Peltier device. The Peltier device permits the wafer to be cooled in a dry atmosphere. There is no need to worry about dew condensation. In FIG. 8, arrows A schematically show heat radiation. The suction stage 5 can move in the horizontal direction in FIG. 8 (direction of the diameter of the wafer 1W).

Then, after the cooling element 5a begins cooling the wafer 1W, patterns on the main surface of the wafer 1W (patterns of chips 1C and cutting regions CR, test pads 1LBt and alignment targets Am in the cutting regions, and pads 1LB inside chips 1C) are recognized from the reverse surface of the wafer 1W through an infrared camera (hereinafter called the IR camera). Then, according to the pattern information obtained from the IR camera, the cutting lines CL are positioned (aligned) (102B-2 in FIG. 2).

Figure 2:
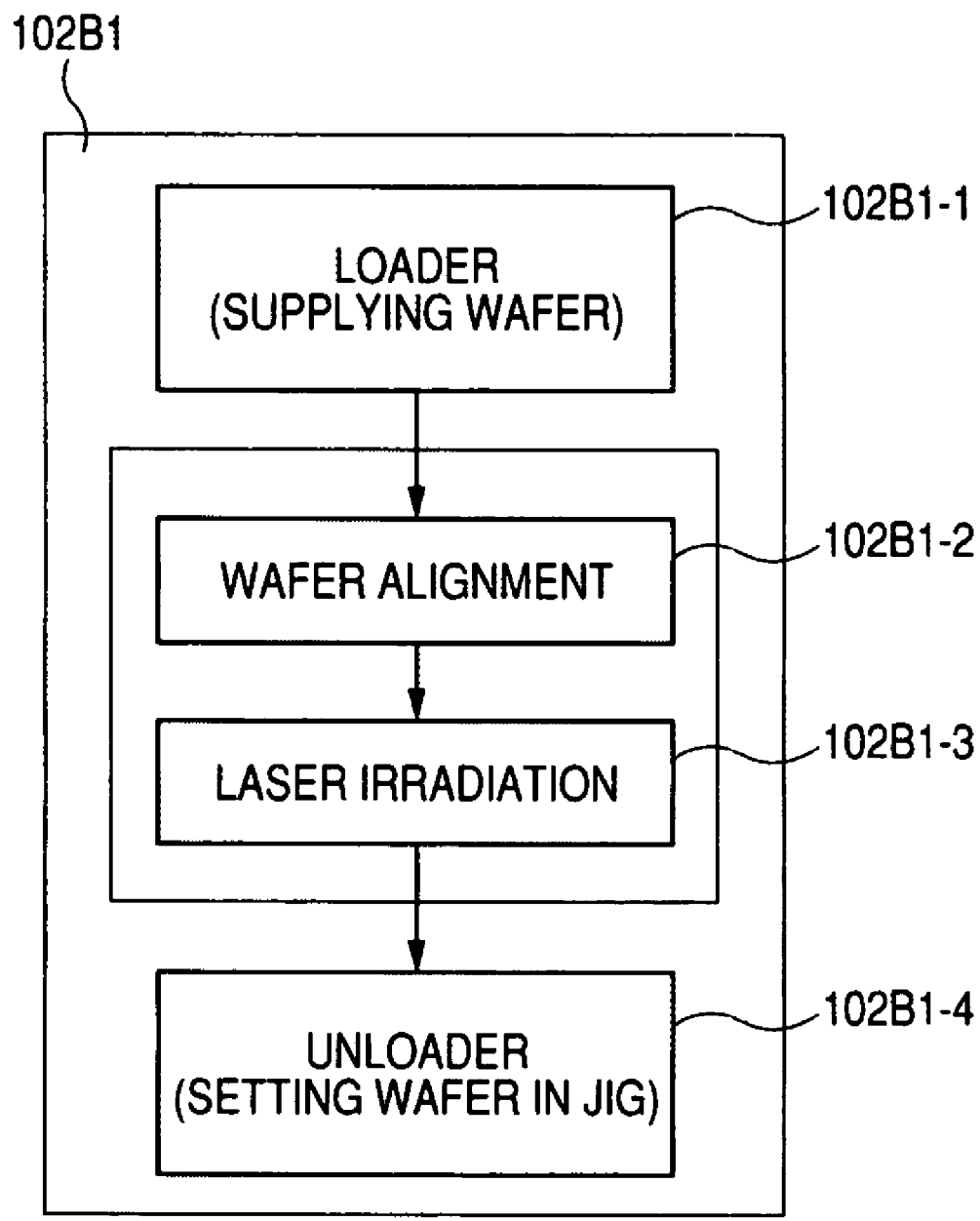
FIG. 2 is a flowchart of a laser irradiation step in the manufacturing process in FIG. 1.

Next, the wafer 1W as cooled is irradiated with a laser beam (energy beam) LB emitted from a laser beam generator where light is focused on the inside of the wafer 1W from the reverse surface of the wafer 1W, and laser irradiation is made by relative movement along the cutting lines CL positioned according to the pattern information (102B-3 in FIG. 2). As a consequence, a modified region (optically damaged area) is formed inside the wafer 1W by multiphoton absorption.

This modified region PL, which is formed by heating and melting the inside of the wafer 1W by multiphoton absorption, serves as the start point for cutting the wafer 1W in the subsequent dicing stage. The molten region may be a region once molten and then re-solidified or a region in its molten state or a region under transition from the molten state to the re-solidified state and may also be considered as a region whose phase or crystal structure has changed. Also, the molten region may be considered as a region whose structure has changed to a different structure (monocrystal, non-crystal or polycrystal). For instance, for the substrate 1S, it means a region whose structure has changed from monocrystal to non-crystal, or from monocrystal to polycrystal, or from monocrystal to a combination of non-crystal and polycrystal structures. The modified region PL formed in the substrate 1S is, for example, non-crystal silicon.

Since the reverse surface of the wafer 1W is the plane of incidence of a laser beam LB, preferably it should be flat and smooth in order to prevent or reduce scattering of the laser beam LB. Also, in formation of a modified region PL the reverse surface of the wafer 1W hardly absorbs the laser beam LB and thus does not melt. Though not limited so, the laser beam LB irradiation conditions are as follows. For example, the laser type is an LD-pumped solid-state pulse laser; the light source is a YAG laser with a wavelength of 1064 nm, a frequency of 400 kHz, laser power of 1W or less, and a laser spot diameter of 1-2 micrometers; the laser oscillator is of the high-repetition type; and the laser beam moving speed is 300 mm/s.

Figure 9:
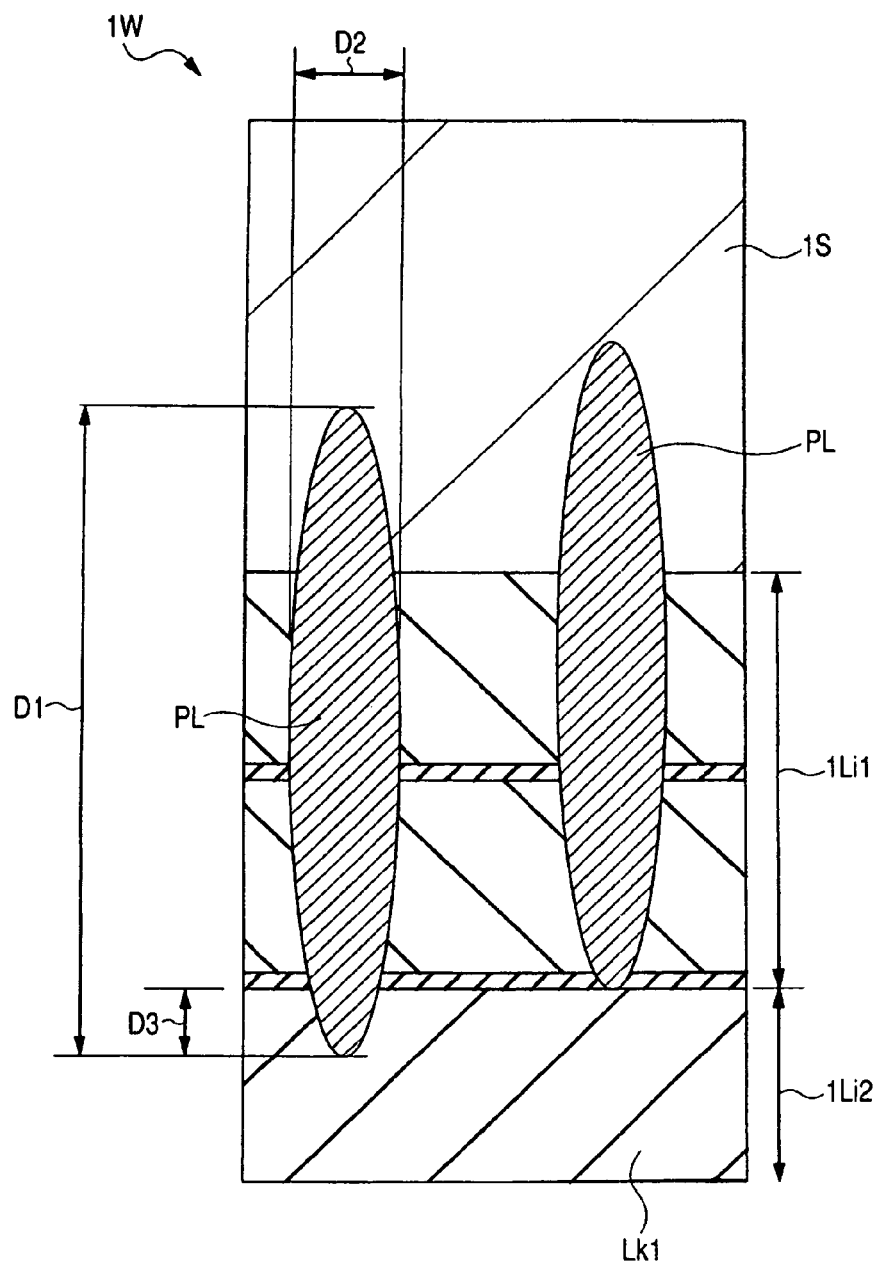
FIG. 9 is an enlarged sectional view of a characteristic part of the semiconductor wafer showing an example of the sectional shape of modified regions in FIG. 8.

FIG. 9 is an enlarged sectional view of a characteristic part of the wafer 1W showing an example of the sectional shape of the modified region PL. As illustrated to the left in FIG. 9, the modified region PL extends from part of the substrate 1S through the interlayer insulating layer 1Li1 to part of the low dielectric constant layer Lk1 of the interlayer insulating layer 1Li2. More specifically, one end of the modified region PL in its longitudinal direction gets into the substrate 1S and the other end gets into part of the low dielectric constant layer Lk1 of the interlayer insulating layer 1Li2. The portion of the modified region PL inside the substrate 1S serves as the splitting start point (where a crack is made) for the substrate 1S in the later dicing step. On the other hand, the portion of the modified region inside the low dielectric constant layer Lk1 of the interlayer insulating layer 1Li2 serves as the splitting start point for the low dielectric constant layer Lk1 of the interlayer insulating layer 1Li2 in the later dicing step. In other words, the modified region PL serves as the splitting start point for both the substrate 1S and the low dielectric constant layer Lk1. This means that both the substrate 1S and the low dielectric constant layer Lk1 can be cut neatly with the modified region PL as the splitting start point in the later dicing step. Hence, in the stealth dicing process, the occurrence of poor appearance of the cracks of the low dielectric constant layer Lk1 such as a defective shape is reduced or prevented.

When the laser beam LB is irradiated so as to let the modified region PL contact or get into the low dielectric constant layer Lk1, the layer Lk1 may discolor because of its low thermal conductivity and the containment of heat of the laser beam LB in the layer Lk1. Therefore, in this first embodiment, in the laser irradiation step the laser beam LB is irradiated while the main surface of the wafer 1W is cooled by the cooling elements 5a. Therefore, temperature rise of the low dielectric constant layer Lk1 is reduced or prevented in the laser irradiation step, thereby reducing or preventing its discoloration. Hence, in the stealth dicing process, the occurrence of poor appearance of cracks of the low dielectric constant layer Lk1 such as discoloration is reduced or prevented.

Dimension D1 of the modified region PL in the substrate 1S thickness direction is larger than its dimension D2 in the substrate 1S radial direction, perpendicular to the substrate 1S thickness direction. This makes it possible to narrow the splitting start point down to a small area and also allow the modified region PL to stretch along the direction in which a crack should be made, so that the wafer 1W (substrate 1S and low dielectric constant layer) can be cut neatly. The modified region PL's longer dimension D1 (in the substrate 1S thickness direction) is, for example, 20-40 micrometers. The modified region PL's shorter dimension D2 (in the width direction, or the substrate S1's radial direction perpendicular to its thickness direction) is, for example, 2-5 micrometers.

If the end of the modified region PL gets too deep into the low dielectric constant layer Lk1, the low dielectric constant layer Lk1 might discolor due to the heat of the laser beam LB. It is desirable that the dimension D3 of the modified region PL's portion inside the low dielectric constant layer Lk1 be 5 micrometers or less, though this depends on the cooling temperature or other factors in laser beam irradiation. Most preferably D3 should be 3 micrometers or so. Consequently, discoloration of the low dielectric constant layer Lk1 in formation of the modified region PL is reduced or prevented and the low dielectric constant layer Lk1 can be cut neatly.

However, if the end of the modified region PL should be too away from the low dielectric constant layer Lk1, discoloration of the low dielectric constant layer Lk1 could be prevented but the modified region PL could not serve as the splitting start point for the low dielectric constant layer Lk1. Therefore, as illustrated on the right in FIG. 9, preferably the end of the modified region PL should at least be in contact with the low dielectric constant layer Lk1. In this case as well, discoloration of the low dielectric constant layer Lk1 in formation of the modified region PL is reduced or prevented and the modified region PL serves as the splitting start point for the low dielectric constant layer Lk1.

Figure 10:
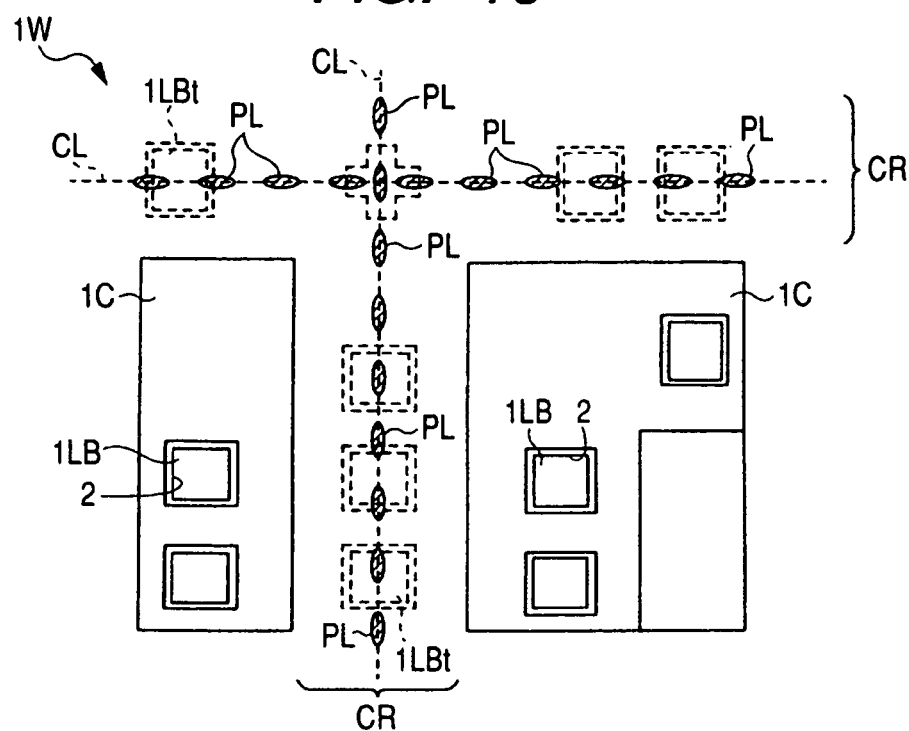
FIG. 10 is an enlarged plan view of a characteristic part of the semiconductor wafer showing an example of the planar arrangement of modified regions in FIG. 8.
Figure 11:
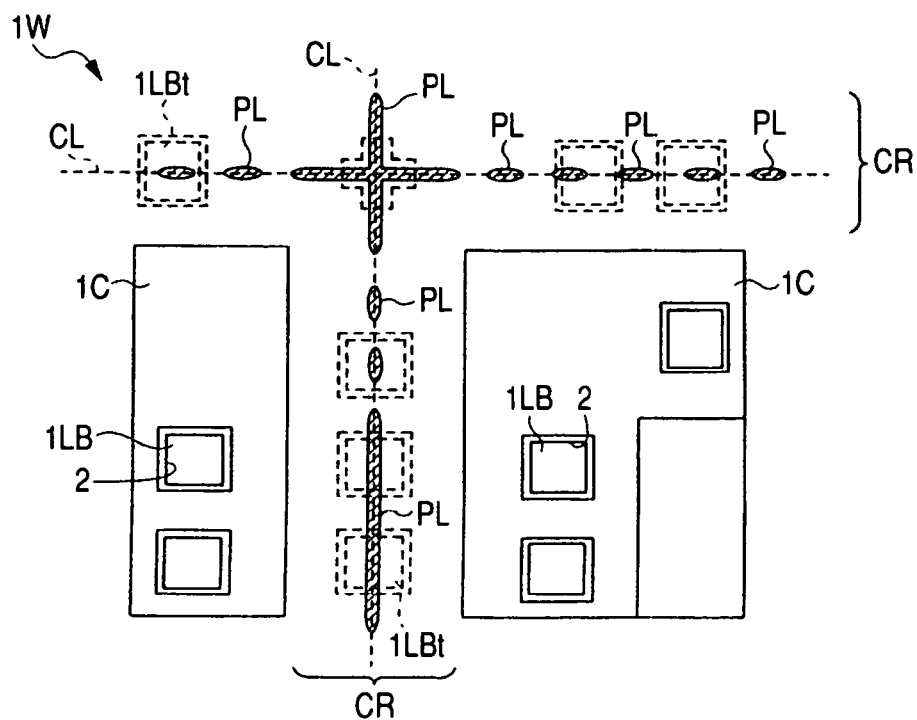
FIG. 11 is an enlarged plan view of a characteristic part of the semiconductor wafer showing another example of modified regions in FIG. 8.

FIGS. 10 and 11 are enlarged plan views of a characteristic part of the wafer 1W showing an example of the planar arrangement of modified regions PL as mentioned above. For easier understanding, the modified regions PL are hatched in FIGS. 10 and 11.

As shown in FIG. 10, modified regions PL are arranged along a cutting line CL in a way to form a dotted line. In other words, modified regions PL are spaced at regular intervals along a cutting line CL. In this case, since the area to be irradiated with a laser beam LB for formation of a modified region PL can be reduced, heat generation by laser beam BL irradiation is minimized and discoloration of the low dielectric constant layer Lk1 due to the heat is reduced or prevented.

FIG. 11 shows that modified regions PL are concentrated on areas where dicing might be difficult, such as intersections of mutually orthogonal cutting lines CL and fine TEG pattern concentrations. This means that areas where dicing might be difficult can be easily cut and the wafer 1W can be cut neatly. The planar arrangement of modified regions PL is not limited to the abovementioned but may be varied; for example, linear arrangement along a cutting line is possible.

After the abovementioned laser irradiation step has been finished, the wafer 1W is transported to an unloader of the laser dicing apparatus and set in a jig (102B1-4 in FIG. 2).

Figure 12:
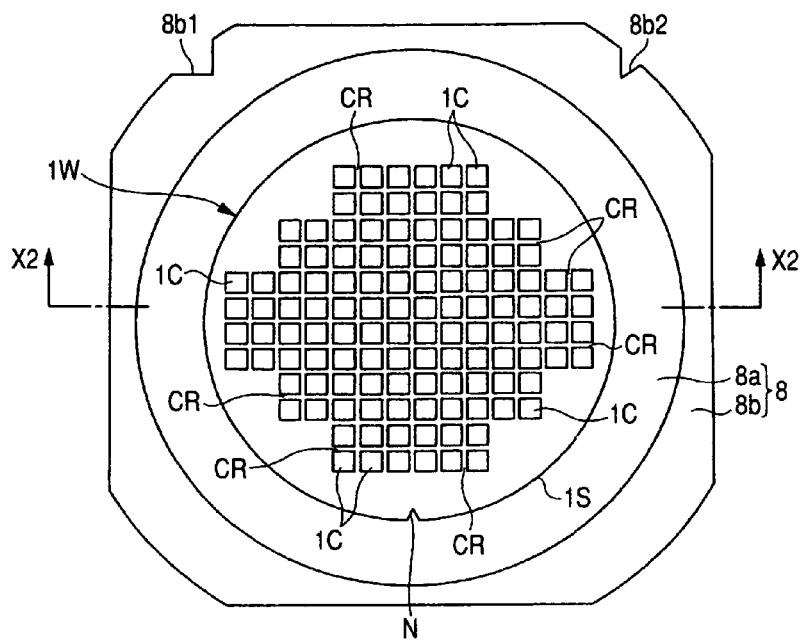
FIG. 12 is a general plan view of a semiconductor wafer after the wafer mounting step in FIG. 1 and a jig onto which it is attached.
Figure 13:
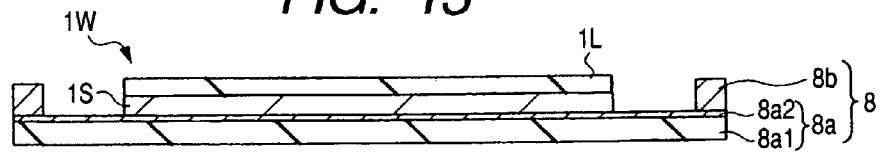
FIG. 13 is a sectional view taken along the line X2-X2 in FIG. 12.

Next, as shown in FIGS. 12 and 13, the wafer 1W unloaded from the laser dicing apparatus is attached onto tape 8a of the jig 8 (wafer mounting step 102B2 in FIG. 1), then the tape 3a is peeled off from the main surface of the wafer 1W (102B3 in FIG. 1).

FIG. 12 is a general plan view of the jig 8 with the wafer 1W attached thereon and FIG. 13 is a sectional view taken along the line X2-X2 in FIG. 12. The jig 8 has tape 8a and a ring (frame) 8b. The base 8a1 of the tape 8a is, for example, made of flexible plastic and its main surface has an adhesive layer 8a2. The tape 8a is firmly fixed on the reverse surface of the wafer 1W. In other words, the wafer 1W is attached onto the tape 8a with its main surface up. It is desirable to use UV tape for the tape 8a. UV tape is adhesive tape with an adhesive layer 8a2 of UV curable resin and has a strong adhesive force. When it is irradiated with ultraviolet rays, the adhesive force of the adhesive layer 8a2 quickly weakens.

The ring 8b is a reinforcing member which supports the tape 8a to prevent it from loosening. From the viewpoint of reinforcement, it is desirable that the ring 8b be made of metal such as stainless steel, but it may be made of a plastic whose thickness is designed to attain the same degree of hardness as metal. There are notches 8b1, 8b2 on the periphery of the ring 8b. These notches 8b1, 8b2 are used in handling the jig and in alignment between the jig 8 and a manufacturing device where the jig 8 is set, and also for hooking the jig 8 to a manufacturing device.

Figure 14:
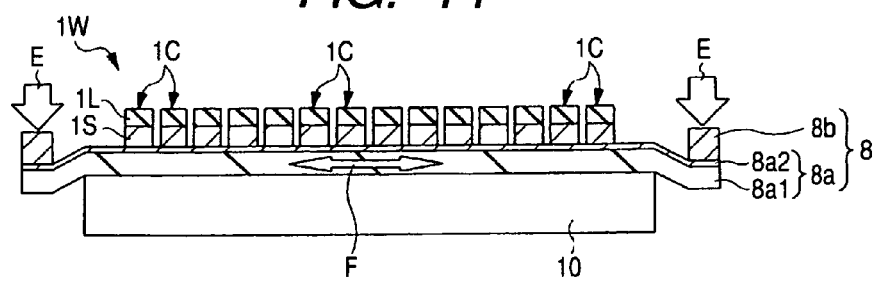
FIG. 14 is a sectional view of the semiconductor wafer after the dicing step in FIG. 1.
Figure 15:
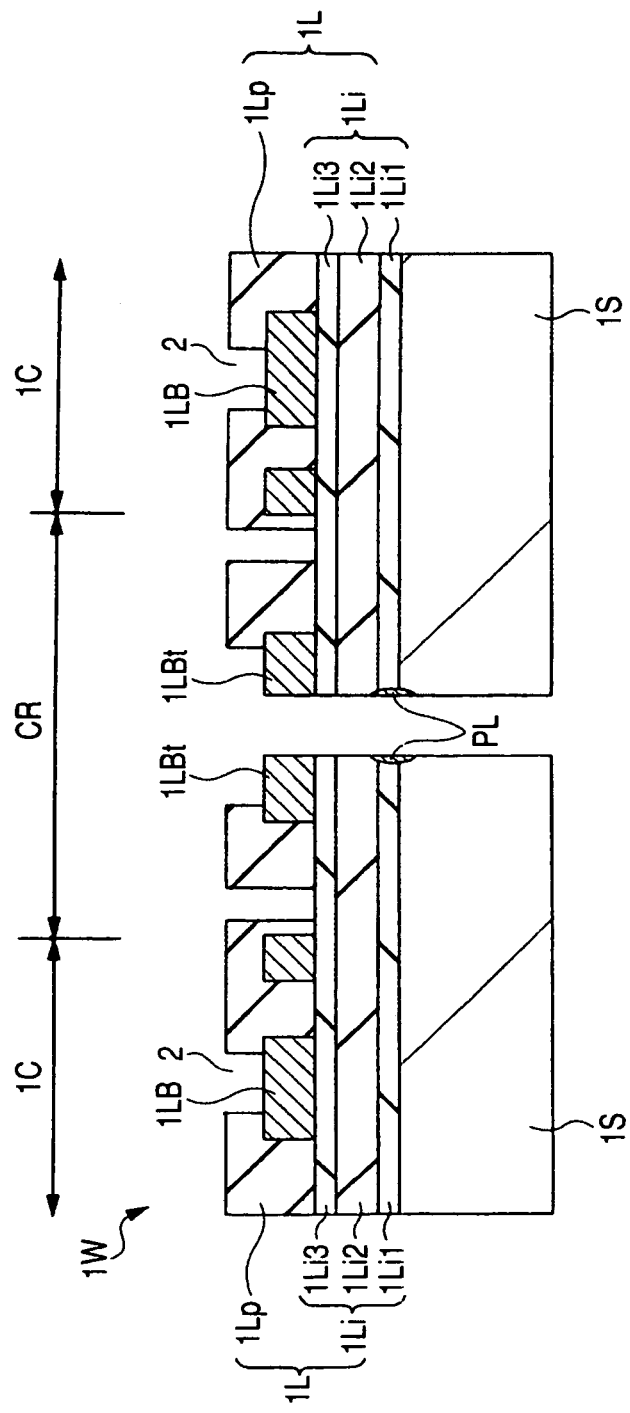
FIG. 15 is an enlarged sectional view of a characteristic part of the semiconductor wafer in FIG. 14.

Then, as shown in FIG. 14, with the jig 8 on a jig rest 10, the ring 8b of the jig 8 is pushed down in the direction of arrow E to expand the tape 8a in the direction of arrow F. As the tape 8a expands, cracks occur along the wafer 1W's thickness direction with modified regions PL as splitting start points and the wafer 1W is divided into separate chips (102B4 in FIG. 1) as illustrated in FIGS. 14 and 15. FIG. 14 is a sectional view of the wafer 1W after the dicing step 102B4 and FIG. 15 is an enlarged sectional view of a characteristic part of the wafer 1W shown in FIG. 14.

According to this first embodiment, since the modified regions PL are formed in a way that their ends are inside the substrate 1S and the low dielectric constant layer Lk1, the substrate 1S and the low dielectric constant layer Lk1 can be neatly cut with the modified regions PL as splitting start points. Consequently, the semiconductor device yield can be improved. By contrast, in case of the blade dicing method which uses a dicing blade to cut the wafer 1W, in order to avoid deterioration in the quality of chips 1C, the cutting speed must be decreased (for example to about 60 mm/s, or depending on the wafer 1W thickness, to less than 60 mm/s) when the wafer 1W is thin, because otherwise chipping would easily occur during cutting with a resulting decline in chip deflecting strength. On the other hand, in this first embodiment, since only the inside of the wafer 1W is cut without damaging its surface, chipping on the chip 1C surface is minimized. Therefore the deflecting strength of chips 1C is increased. In addition, since modified regions are formed quickly at a rate of 300 nm/sec as a preparatory step for cutting, throughput is improved. Besides, since test pads 1LBt which do not transmit a laser beam exist in the cutting regions CR of the main surface of the wafer 1W as mentioned above, if the wafer 1W should be irradiated with a laser beam from its main surface, the test pads 1LBt might hamper modification (formation of modified regions). On the other hand, in this embodiment, since the wafer 1W is irradiated with a laser beam from its reverse surface, modified regions PL are formed properly without causing the above problem and the wafer 1W is cut properly.

Next is the assembly stage 102C. Here the jig 3 with plural chips 1C held thereon is transported to a pickup device. Then, the chips 1C are pushed up from the reverse side of the tape 8a by a thrust pin with the reverse side of the tape 8a held by vacuum suction. In case that the tape 8a is UV tape as mentioned above, irradiation of the adhesive layer 8a2 of the tape 8a with ultraviolet rays cures the layer and weakens its adhesive force. Then the pickup device's collet picks up the chips 1C by vacuum suction (pickup step 102C1 in FIG. 1).

Next, each chip 1C thus picked up is transported, for example, to a chip mounting area of a printed circuit board or lead frame and mounted on the chip mounting area of the printed circuit board, etc through an adhesive agent. As a result, the reverse surface of the chip 1C is bonded to the printed circuit board, etc. (die bonding step 102C2 in FIG. 1). Alternatively, the chips picked up may be put in a transport tray and shipped to another manufacturing factory (for instance, an assembly fab) where the subsequent assembly steps are carried out (103A in FIG. 1).

Next, the pads 1LB on the main surface of the chip 1C are connected with electrodes of the printed circuit board, etc by bonding wires (hereinafter called wires) (102C3 in FIG. 1). Then the chip 1C is encapsulated in a package of plastic like epoxy resin by a transfer mold technique (102C4 in FIG. 1).

If the chip 1C has a bump electrode, the chip 1C is transported to the chip mounting area of the printed circuit board, etc with the main surface of the chip 1C down in the pickup step 102C and the bump electrode of the chip 1C is temporarily fixed onto an electrode in the chip mounting area using a paste before the bump electrode of the chip 1C and the electrode of the printed circuit board 15 are bonded together by reflow processing (heat treatment) (flip chip bonding). After that, the space between the opposite faces of the chip 1C and printed circuit board, etc is filled with under fill and the chip 1C is encapsulated in the same way as above.

Figure 16:
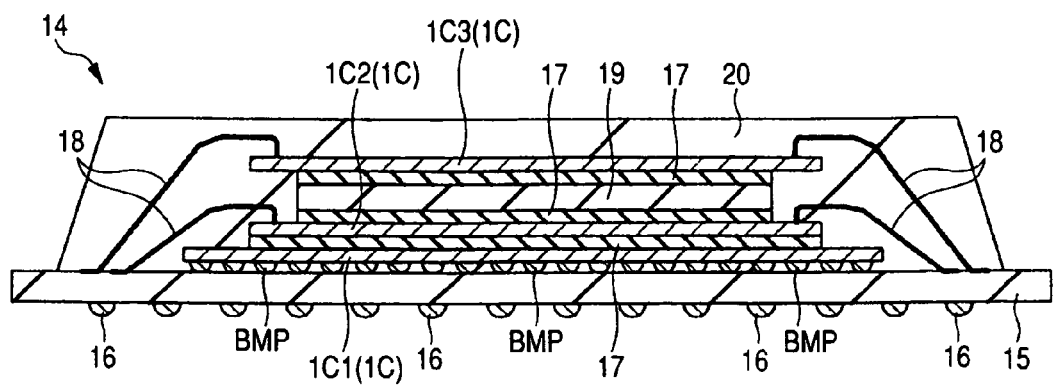
FIG. 16 is a sectional view of an example of a semiconductor device manufactured by the semiconductor device manufacturing method according to the first embodiment of the invention.

FIG. 16 is a sectional view of an example of a semiconductor device 14 manufactured by the semiconductor device manufacturing method according to the first embodiment. The semiconductor device 14 is an SIP (System In Package) which incorporates desired functions in a package. There is a matrix of bump electrodes 16 on the reverse surface of a printed circuit board 15 as a constituent of the semiconductor device 14. Plural thin chips 1C1 to 1C3 (1C) are stacked on the main surface of the printed circuit board 15. The bottom chip 1C1 is mounted, through bump electrodes BMP on its main surface, over the main surface of the printed circuit board 15. Logical circuits such as a CPU (Central Processing Unit) and a DSP (Digital Signal Processor) are formed on the main surface of the chip 1C1. The chip 1C2 is mounted over the reverse surface of the chip 1C1 through die attach film. Memory circuits such as an SRAM (Static Random Access Memory) and a flash memory are formed over the main surface of the chip 1C2. The pads 1LB on the main surface of the chip 1C2 are electrically connected with electrodes on the main surface of the printed circuit board 15 through wires 18. The chip 1C3 is mounted over the main surface of the chip 1C2 through spacer 19 and die attach film 17. Memory circuits such as an SRAM and a flash memory are formed over the main surface of the chip 1C3 and the pads 1LB on the main surface of the chip 1C3 are electrically connected with electrodes on the main surface of the printed circuit board 15 through wires 18. The chips 1C1 to 1C3 and the wires 18 are encapsulated, for example, in a package 20 of epoxy resin.

Second Embodiment

In the second embodiment, a modified region mainly serving as a splitting start point for the substrate 1S and a modified region mainly serving as a splitting start point for the low dielectric constant layer Lk1 are separate from each other. This will be described below in reference to FIGS. 17 to 20.

Figure 17:
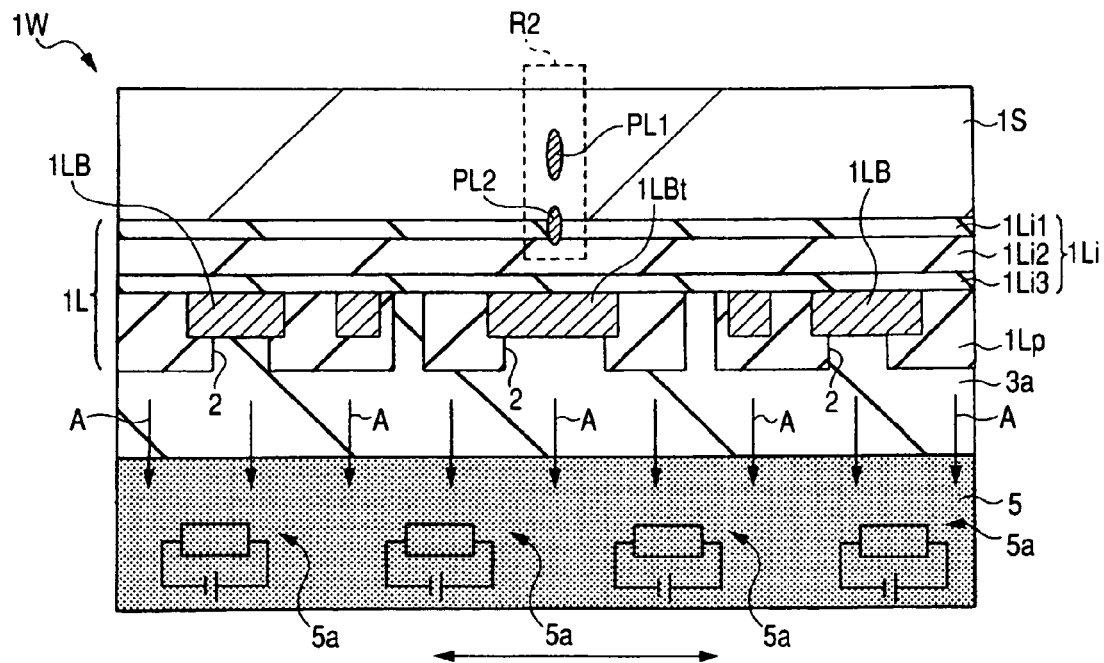
FIG. 17 is a sectional view of a semiconductor wafer after the laser irradiation step in FIG. 1 in a semiconductor device manufacturing process according to another embodiment of the invention, taken along the line X1-X1 in FIG. 5.
Figure 18:
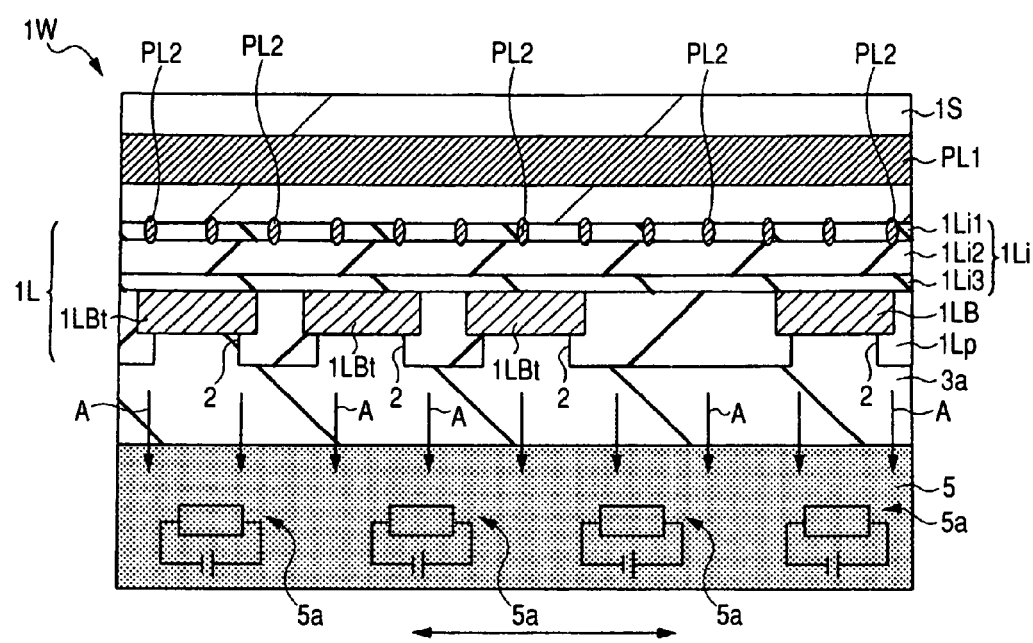
FIG. 18 is a sectional view of the semiconductor wafer after the laser irradiation step in FIG. 1, taken along the line Y1-Y1 perpendicular to the line X1-X1 in FIG. 5.
Figure 19:
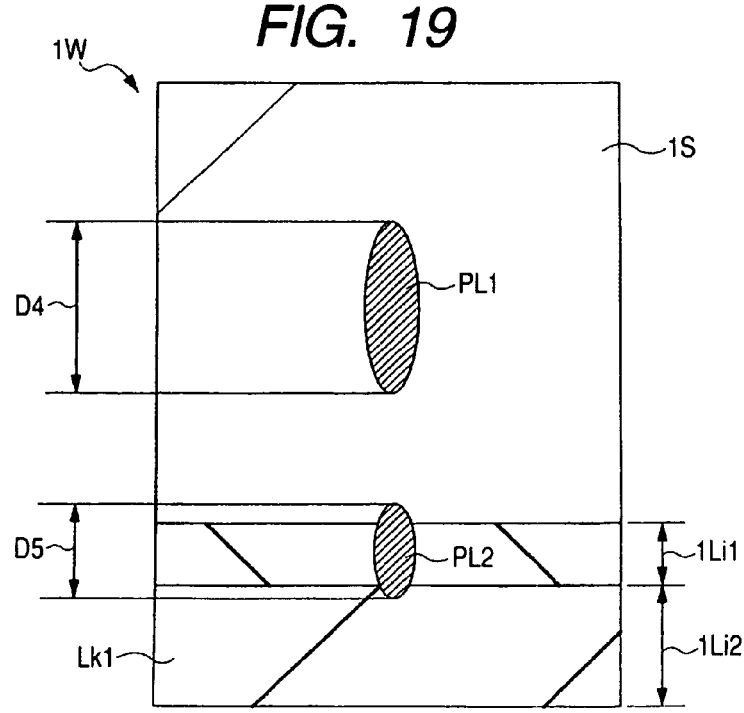
FIG. 19 is an enlarged sectional view of a region R2 in FIG. 17.

FIG. 17 is a sectional view of the wafer 1W after the laser irradiation step 102B1 in FIG. 1, taken along the line X1-X1 in FIG. 5; FIG. 18 is a sectional view of the wafer 1W after the laser irradiation step 102B1 in FIG. 1, taken along the line Y1-Y1 perpendicular to the line X1-X1 in FIG. 5; and FIG. 19 is an enlarged sectional view of a region R2 in FIG. 17.

In the second embodiment, two types of modified regions PL1, PL2 (PL) are formed in the wafer 1W by laser irradiation. A modified region PL1 mainly serves as a splitting start point for the substrate 1S. The modified regions PL1 lie in the center in the substrate 1S thickness direction when viewed sectionally. This permits the substrate 1S to be diced neatly in the dicing step 102B4. Modified regions PL1 continuously stretch along a cutting line CL linearly when viewed from above. Dimension D4 of a modified region PL1 in the substrate 1S thickness direction is, for example, 20-40 micrometers and its width is almost the same as in the first embodiment.

On the other hand, each modified region PL2, which mainly serves as a splitting start point for the low dielectric constant layer Lk1, is away from the modified region PL1. When viewed sectionally, the modified region PL2 is smaller in section area than the modified region PL1 and partially lies inside the low dielectric constant layer Lk1. The position of the modified region PL2 in relation to the low dielectric constant layer Lk1 is the same as that of the modified region PL in the first embodiment. When viewed from above, modified regions PL2 are non-continuous, taking the shape of a broken line along a cutting line CL. Therefore, whether viewed sectionally or from above, a modified region PL2 is smaller in area than a modified region PL1. Therefore, the area to be irradiated with a laser beam LB for formation of the modified region PL2 can be reduced and heat generation by laser beam BL irradiation is minimized and discoloration of the low dielectric constant layer Lk1 is reduced or prevented. Dimension D5 of the modified region PL2 in the substrate 1S thickness direction is, for example, 10-20 micrometers and its width is almost the same as in the first embodiment. Modified regions PL1, PL2 may be formed by a single bifocal laser irradiation or by separate laser irradiations (two scans along the same line). Laser irradiation for formation of modified regions PL1, PL2 is performed while the wafer 1W is being cooled, as in the first embodiment.

Figure 20:
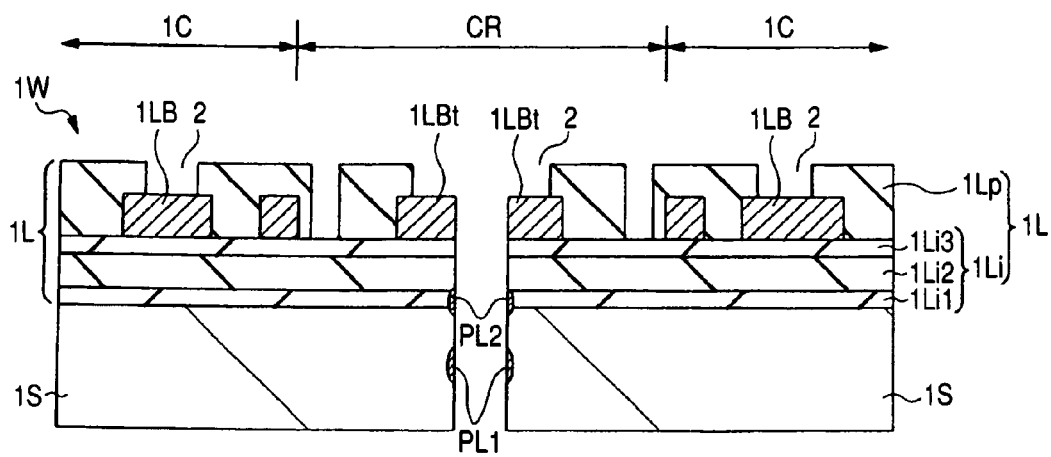
FIG. 20 is an enlarged sectional view of a characteristic part of the semiconductor wafer after the dicing step in FIG. 1 in a semiconductor device manufacturing process according to another embodiment of the invention.

FIG. 20 is an enlarged sectional view of a characteristic part of the wafer 1W after the dicing step 102B4 in FIG. 1 according to the second embodiment. The dicing process is the same as described in reference to FIGS. 14 and 15 for the first embodiment except the following points. In the second embodiment, with the jig 8 on the jig rest 10 as shown in FIG. 14, the ring 8b of the jig 8 is pushed down in the direction of arrow E to expand the tape 8a in the direction of arrow F; as the tape 8a expands, the substrate 1S cracks along the wafer 1W's thickness direction with a modified region PL1 as a splitting start point and the low dielectric constant layer Lk1 cracks with a modified region PL2 as a splitting start point. Thus the wafer 1W is divided into separate chips 1C where the substrate 1S and the low dielectric constant layer Lk1 are neatly cut as illustrated in FIG. 20.

Third Embodiment

Variations of the cooling method used in the laser irradiation step according to the third embodiment will be described below.

Figure 21:
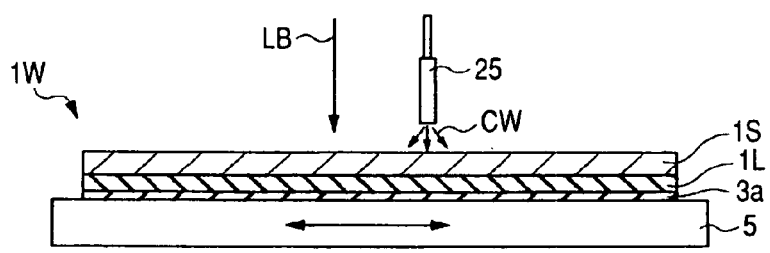
FIG. 21 is a sectional view of the semiconductor wafer in the laser irradiation step.
Figure 22:
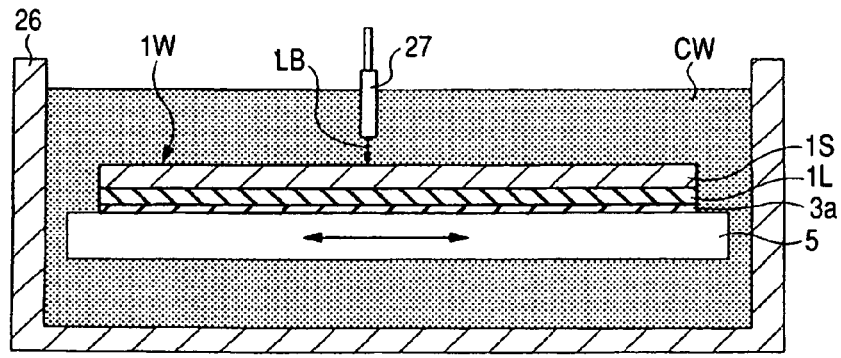
FIG. 22 is a sectional view of the semiconductor wafer in the laser irradiation step.

FIGS. 21 and 22 are sectional views of the wafer 1W in the laser irradiation step. FIG. 21 shows that cooling water is sprayed over the reverse surface of the wafer 1W through a nozzle 25 while the reverse surface is irradiated with a laser beam. The wafer 1W is thus cooled and the cooling temperature is, for example, −40° C. to 5° C.

FIG. 22 shows that the whole wafer 1W is immersed in cooling water CW in a cooling bath 26 and irradiated with a laser beam LB from its reverse surface. Here, a beam emitter 27 for the laser beam LB is immersed in the cooling water CW. This reduces or eliminates distortion of the laser beam LB which might occur due to a difference in refraction index. The cooling temperature is, for example, −40° C. to 5° C.

Figure 23:
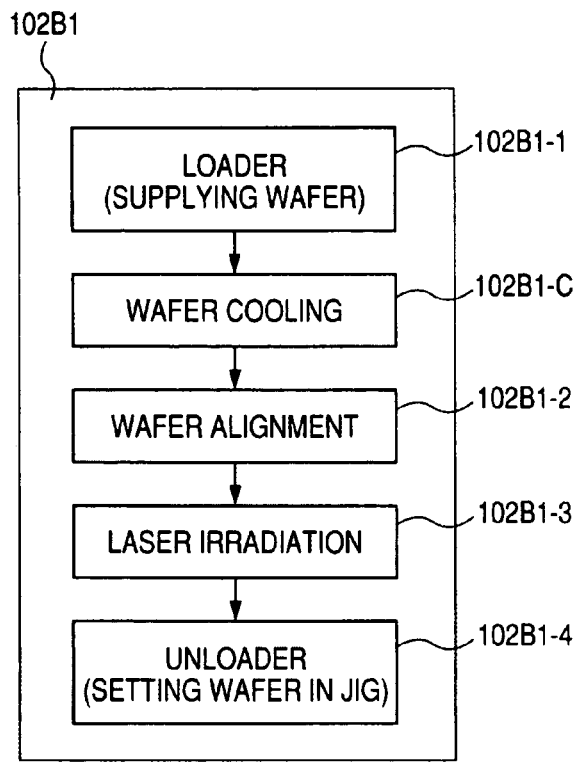
FIG. 23 is a flowchart of the laser irradiation step in a semiconductor device manufacturing process according to another embodiment of the invention.

In both the above cooling methods, cooling is done during irradiation with a laser beam LB. However, the invention is not limited thereto; it is also possible to irradiate the wafer 1W with a laser beam LB just after cooling it. FIG. 23 is a flowchart of the latter case of laser irradiation and FIG. 24 illustrates how cooling is done.

Figure 24:
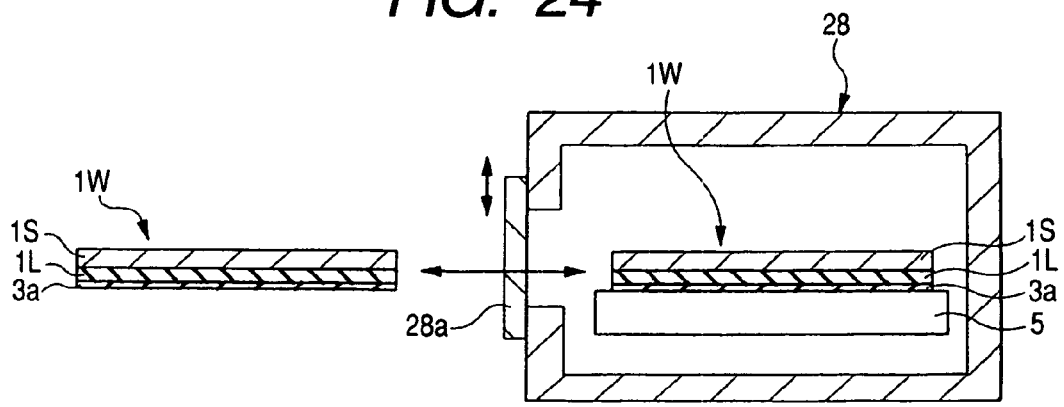
FIG. 24 illustrates the cooling step in the semiconductor device manufacturing process in FIG. 23.

Here, as in the first embodiment, after the wafer 1W with tape 3a on its main surface is transported to the loader of the laser dicing apparatus (102B1-1 in FIG. 23), a shutter 28a of a freezer 28 is opened to house the wafer 1W in the freezer 28 as shown in FIG. 24 and the shutter 28a is closed to cool the wafer 1W for a desired time duration (102B1-C in FIG. 23). The cooling temperature is, for example, −30° C. to 5° C. Then, after the wafer 1W is cooled to a desired temperature, the shutter 28a is opened and the wafer 1W is taken out and placed on the suction stage 5 of the laser dicing apparatus. The subsequent steps are the same as in the first embodiment.

Fourth Embodiment

How die attach film 17 is attached onto the reverse side of a chip 1C according to the fourth embodiment will be described below in reference to FIGS. 25 and 26. The other steps are the same as in the first to third embodiments.

Figure 25:
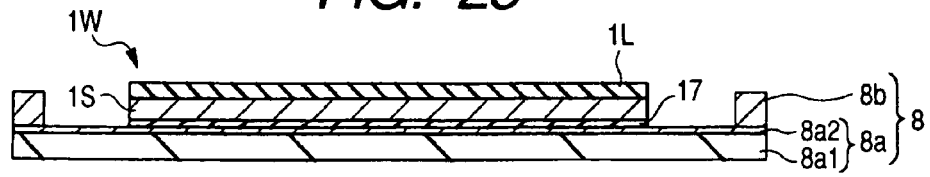
FIG. 25 is a sectional view of the jig and the semiconductor wafer after the wafer mounting step in FIG. 1 in a semiconductor device manufacturing process according to another embodiment of the invention.
Figure 26:
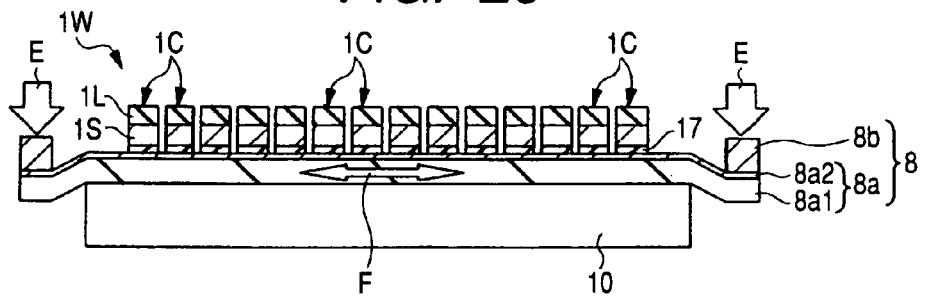
FIG. 26 is a sectional view of the jig and the semiconductor wafer after the dicing step in FIG. 1 next to the step in FIG. 25.

FIG. 25 is a sectional view of the jig 8 and wafer 1W after the wafer mounting step 102B2 in FIG. 1 and FIG. 26 is a sectional view of the jig 8 and wafer 1W after the dicing step 102B4.

As in the first and second embodiments, in the wafer mounting step 102B2 after completion of the sequence from the front-end process 100 up to the laser irradiation step 102B1, a jig 8 with die attach film 17 attached onto the adhesive layer 8a2 of tape 8a is prepared and the wafer 1W is attached through the die attach film 17 onto the tape 8a. In other words, in the fourth embodiment, die attach film 17 is bonded to the reverse surface of the wafer 1W in the wafer mounting step 102B2. Die attach film 17 is soft enough to be cut when expanded and, for example, made of polyimide resin. After that, as illustrated in FIG. 26, the wafer 1W is diced into separate chips 1C as in the first embodiment and the die attach film 17 is also diced together. In this way, a chip 1C with die attach film 17 on its reverse surface is prepared.

Fifth Embodiment

How to make slits in a conductor pattern (test pads 1LBt, etc) in a cutting region CR according to the fifth embodiment will be described in reference to FIGS. 27 to 29. The other steps are the same as in the first to fourth embodiments.

Figure 27:
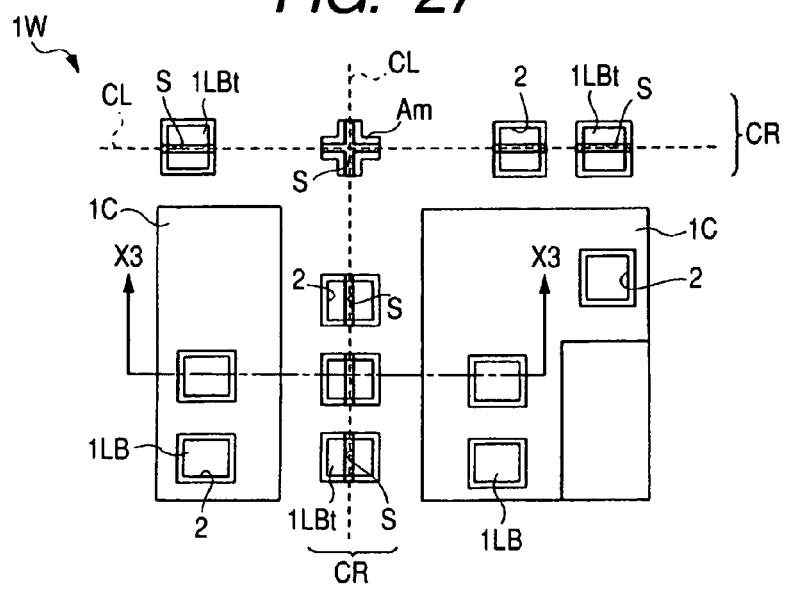
FIG. 27 is an enlarged plan view of a characteristic part of the main surface of the semiconductor wafer after the front-end process in FIG. 1 in a semiconductor device manufacturing process according to another embodiment of the invention.
Figure 28:
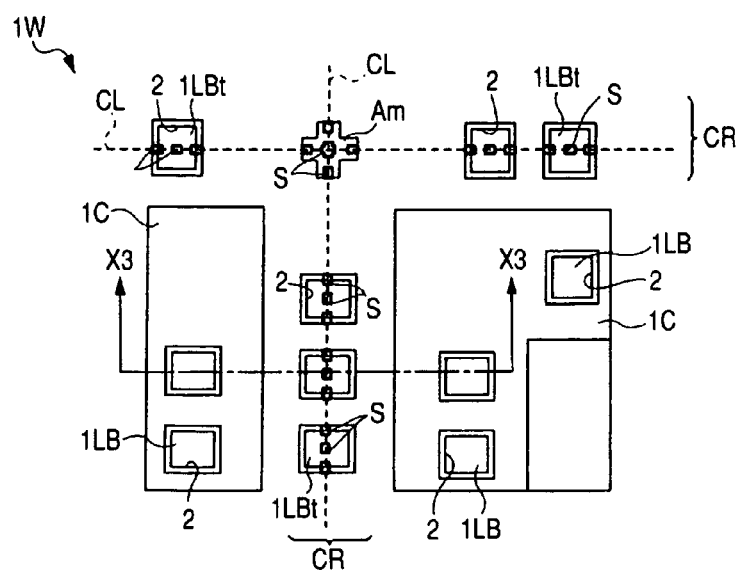
FIG. 28 is an enlarged plan view of a characteristic part of the main surface of the semiconductor wafer after the front-end process in FIG. 1 in a semiconductor device manufacturing process according to a further embodiment of the invention.
Figure 29:
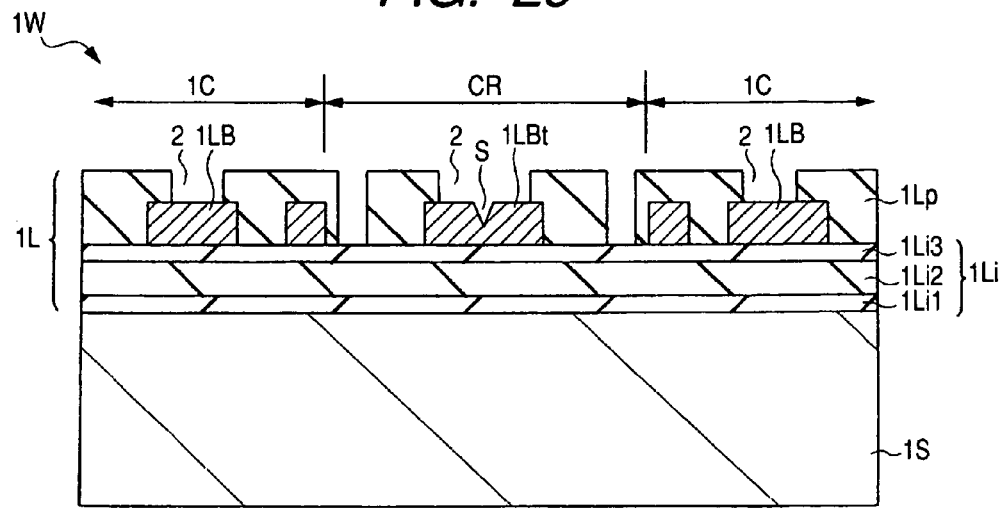
FIG. 29 is a sectional view taken along the line X3-X3 in FIGS. 27 and 28.

FIGS. 27 and 28 are enlarged plan views of a characteristic part of the main surface of the wafer 1W after the front-end process 100 in FIG. 1; and FIG. 29 is a sectional view taken along the line X3-X3 in FIGS. 27 and 28.

In the fifth embodiment, slits S for dicing are made on the top surfaces of the test pads 1LBt and alignment target Am in each cutting region CR. When the wafer 1W is diced into separate chips 1C by stealth dicing, these slits S for dicing facilitate dicing or serve as splitting start points so that the pads 1LBt and alignment target Am in the cutting region CR are split neatly along the cutting line CL (indicated by broken line).

When viewed from above, the slits S stretch like a straight line (continuous) as shown in FIG. 27 or a broken line (non-continuous) as shown in FIG. 28; and when viewed sectionally, their depth is midway in the thickness of the pads 1LBt and alignment target Am as shown in FIG. 29. Although the sectional shape of the slits S shown here is V, it is not so limited and may be another shape such as U or concave.

A slit S is made by etching (wet or dry etching) with a photoresist pattern as an etching mask. However, the method of making a slit S is not limited thereto but may be varied; for example, it is possible to use a mechanical method in which a machining tool is pressed against the top surfaces of the pads 1LBt and alignment target Am or a similar method or a method in which an energy beam such as a laser beam or focused ion beam is cast along the cutting line CL. These methods contribute to simplification of the manufacturing method because photoresist pattern generation is not required.

When slits S are arranged like a broken line as shown in FIG. 28, contact between a test pad 1LBt and a probe (to be put on it) is improved in the testing process 101 in FIG. 2 so that test reliability is increased.

Thanks to these slits S, in the step of dicing the wafer 1W into separate chips 1C as in the first and second embodiments, the test pads 1LBt and alignment target Am can be neatly cut along the slits in them with reduced conductor debris, so that semiconductor device reliability is improved.

Sixth Embodiment

A semiconductor device manufacturing method according to the sixth embodiment will be described below in accordance with a flowchart in FIG. 30 in reference to FIGS. 31 to 35.

Figure 31:
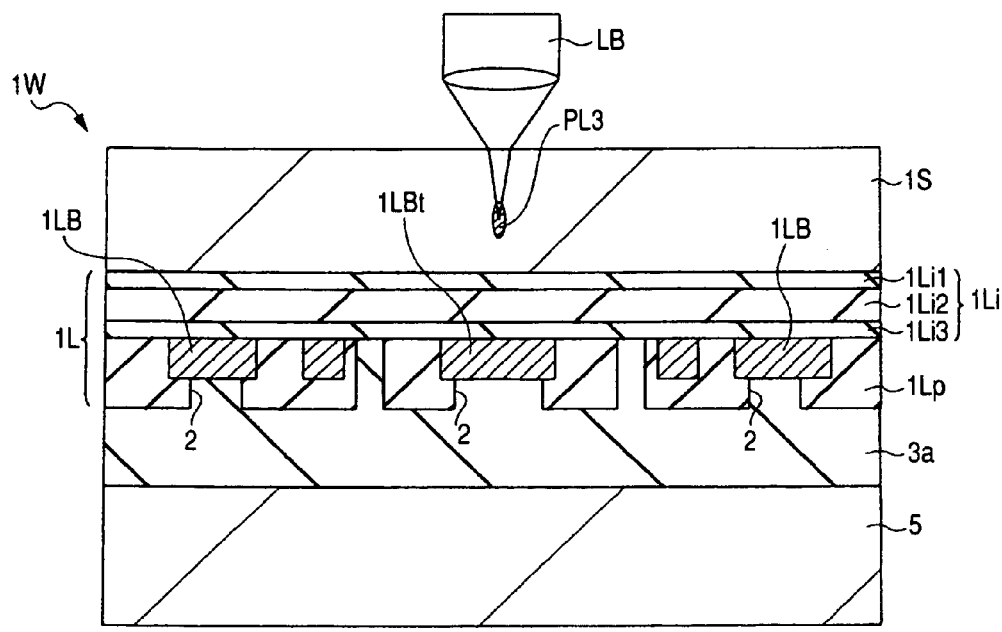
FIG. 31 is a sectional view of a characteristic part of the semiconductor wafer in the laser irradiation step of a semiconductor device manufacturing process according to another embodiment of the invention.

As in the first embodiment, after completion of the sequence from the front-end process 100 up to the reverse surface machining step 102A3, the dicing process 102B follows. In the dicing process, as in the first embodiment, a wafer 1W is placed on the suction stage 5 of the laser dicing apparatus (102B1-1 in FIG. 2) and the cutting line CL is aligned according to pattern information obtained from the IR camera (102B-2 in FIG. 2). Next, as shown in FIG. 31, the wafer 1W is irradiated with a laser beam LB emitted from a laser beam generator where light is focused on the inside of the wafer 1W from the reverse surface of the wafer 1W, and relative movement of the beam is made along the cutting lines CL (102B-3 in FIG. 2). As a consequence, a modified region PL3 is formed inside the wafer 1W.

FIG. 31 is a sectional view of a characteristic part of the wafer 1W in the laser irradiation step. The modified region PL3 serves as a splitting start point for the substrate 1S in the dicing step 102B4 and almost in the center in the thickness of the substrate 1S. However, no part of the modified region PL3 is inside, or in contact with, the low dielectric constant layer Lk1 of the interlayer insulating layer 1Li2. In the sixth embodiment, the wafer 1W need not be cooled in the laser irradiation step.

Figure 30:
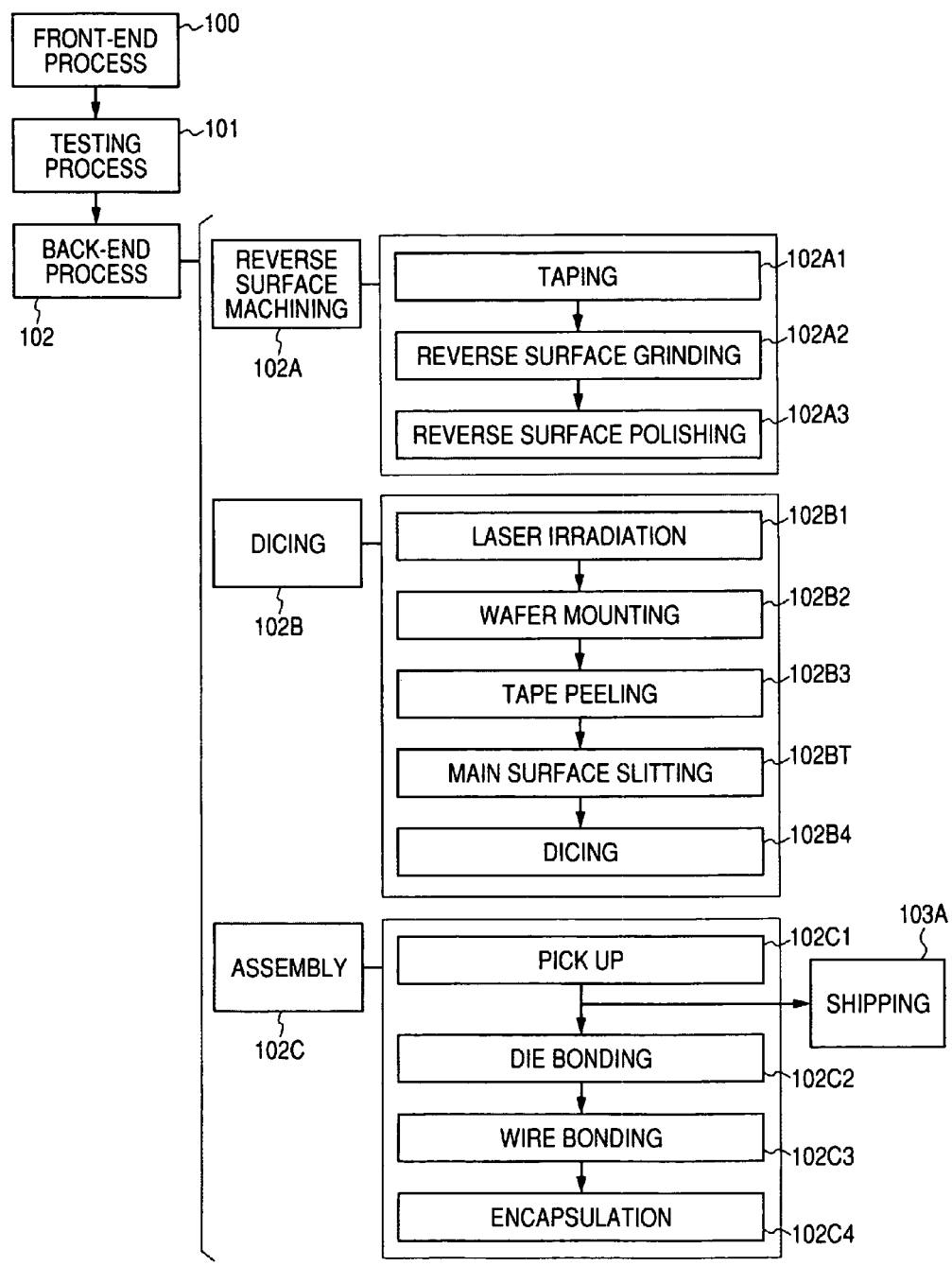
FIG. 30 is a flowchart of a semiconductor device manufacturing process according to another embodiment of the invention.
Figure 32:
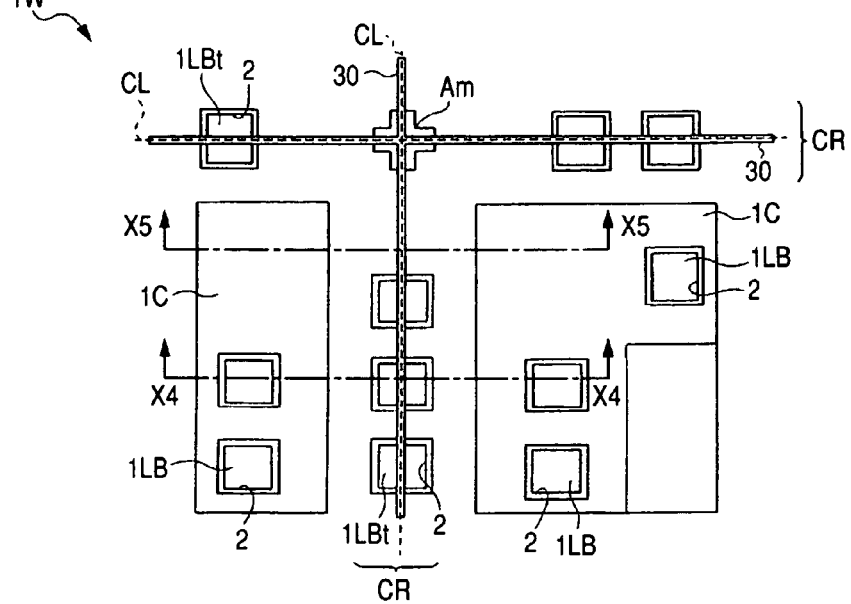
FIG. 32 is an enlarged plan view of a characteristic part of an example of the semiconductor wafer after the step in FIG. 31 in a semiconductor device manufacturing process.
Figure 33:
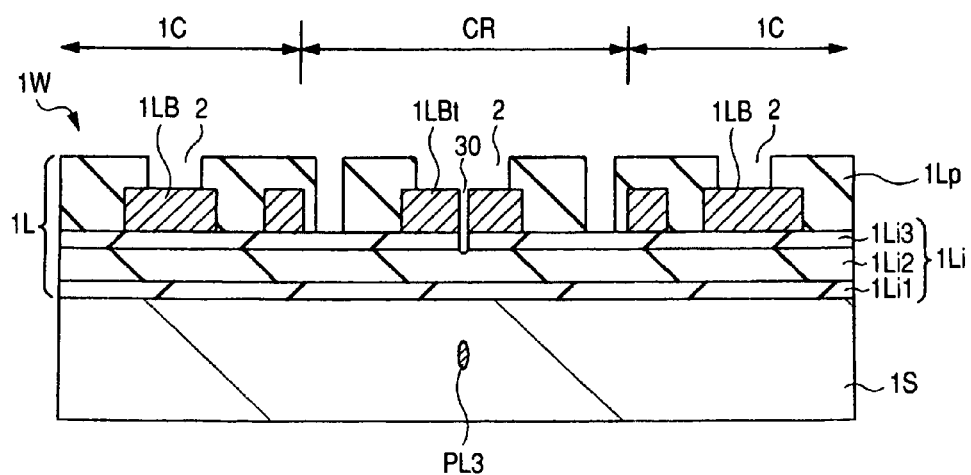
FIG. 33 is a sectional view taken along the line X4-X4 in FIG. 32.
Figure 34:
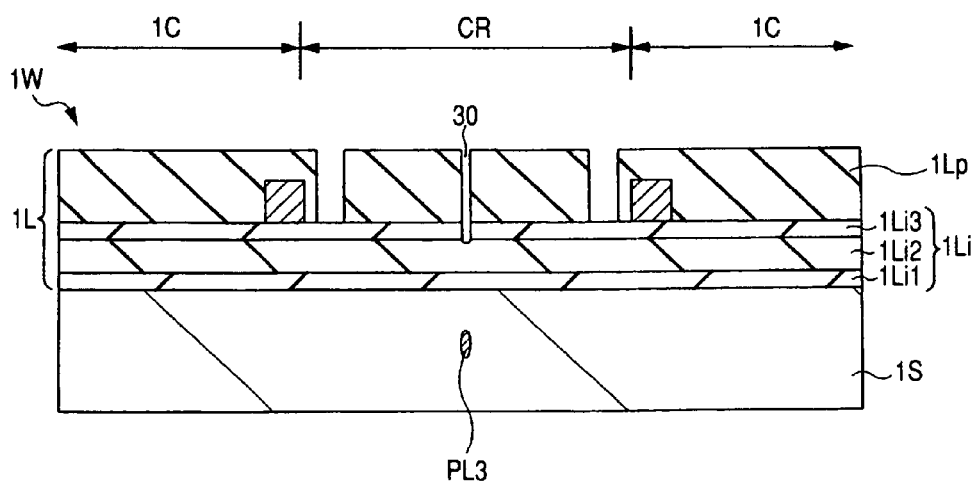
FIG. 34 is a sectional view taken along the line X5-X5 in FIG. 32.

Next, as in the first embodiment, after completion of the wafer mounting step 102B2 and tape peeling step 102B3 in FIG. 30, a slit 30 is made on the main surface of the wafer 1W along a cutting line CL in a cutting region CR of the wafer 1W as shown in FIGS. 32, 33 and 34. FIG. 32 is an enlarged plan view of a characteristic part of an example of the wafer 1W; FIG. 33 is a sectional view taken along the line X4-X4 in FIG. 32; and FIG. 34 is a sectional view taken along the line X5-X5 in FIG. 32.

A slit 30 serves as a splitting start point for the low dielectric constant layer Lk1 of the interlayer insulating layer 1Li2 in the dicing step 102B4 and stretches down from the top of the protective layer 1Lp and pad 1Lbt to the extent that it contacts the low dielectric constant layer Lk1 or partially gets into the low dielectric constant layer Lk1. Since a slit 30 should serve as a splitting start point, the narrower it is the better it is (for example, 5 micrometers or so). A slit 30 is made, for example, with a dicing saw or cutter. Instead, a slit 30 may be made by dry or wet etching, for example, using a hard mask with an etching selectivity with respect to the surface protective layer or interlayer insulating layer.

As mentioned above, in the sixth embodiment, since each slit 30 contacts, or partially gets into, the low dielectric constant layer Lk1 of the interlayer insulating layer 1Li2, the occurrence of poor appearance of the cracks of the low dielectric constant layer Lk1 such as a defective shape is reduced or prevented. In addition, since not a modified region but a slit 30 serves as a splitting start point for the low dielectric constant layer Lk1, discoloration of the low dielectric constant layer Lk1 cannot occur in formation of a splitting start point. Hence, semiconductor device yield is improved. Also, in the sixth embodiment, since the wafer 1W need not be cooled in the laser irradiation step, the semiconductor device manufacturing time can be shortened.

Figure 35:
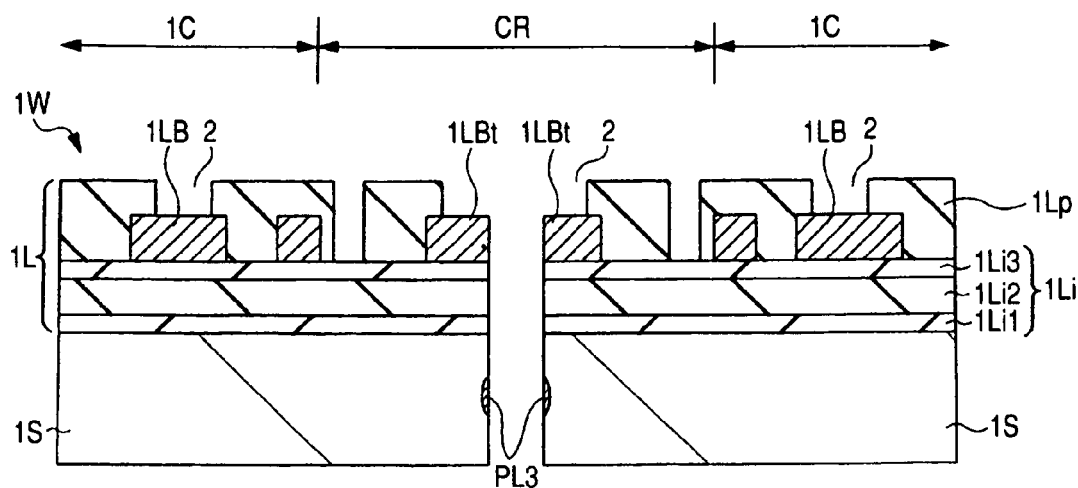
FIG. 35 is an enlarged sectional view of a characteristic part of the semiconductor wafer after the dicing step in FIG. 30.

Next, as in the first embodiment, the wafer 1W is diced into separate chips 1C as shown in FIG. 35 (102B4 in FIG. 30). FIG. 35 is an enlarged sectional view of a characteristic part of the wafer 1W after the dicing step 102B4. In the sixth embodiment, the substrate 1S is cut with modified regions PL3 as splitting start points and the low dielectric constant layer Lk1 is cut with slits 30 as splitting start points. The wafer 1W is thus diced neatly. The subsequent steps are the same as in the first embodiment and their descriptions are omitted.

Seventh Embodiment

According to the seventh embodiment, the method of removing the protective layer 1Lp in a cutting region CR of the main surface of the wafer 1W along a cutting line CL in the front-end process to make a slit will be described below.

Figure 36:
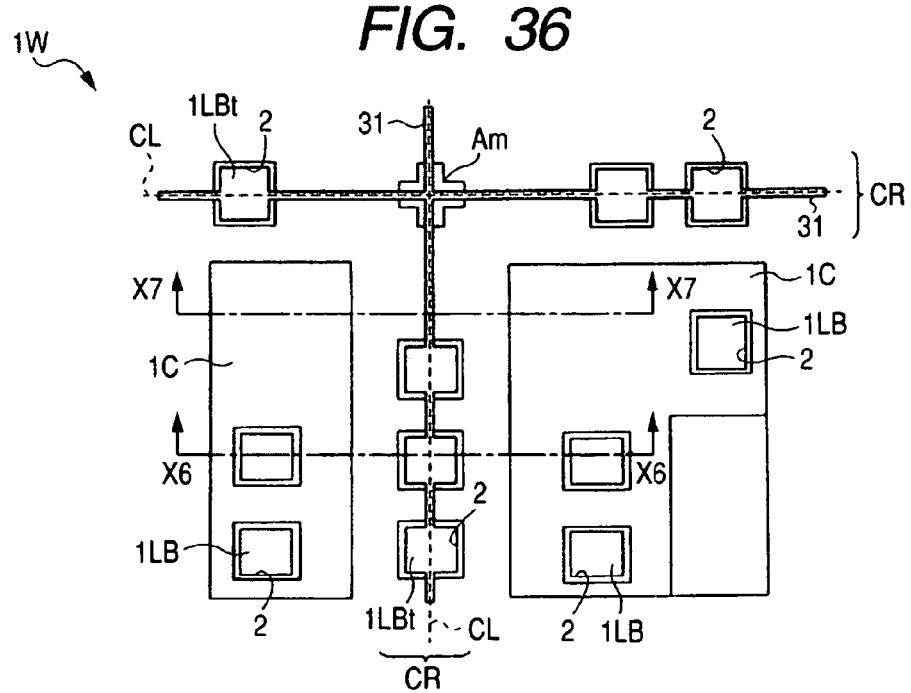
FIG. 36 is an enlarged plan view of a characteristic part of the semiconductor wafer after the front-end process in a semiconductor device manufacturing process according to another embodiment of the invention.
Figure 37:
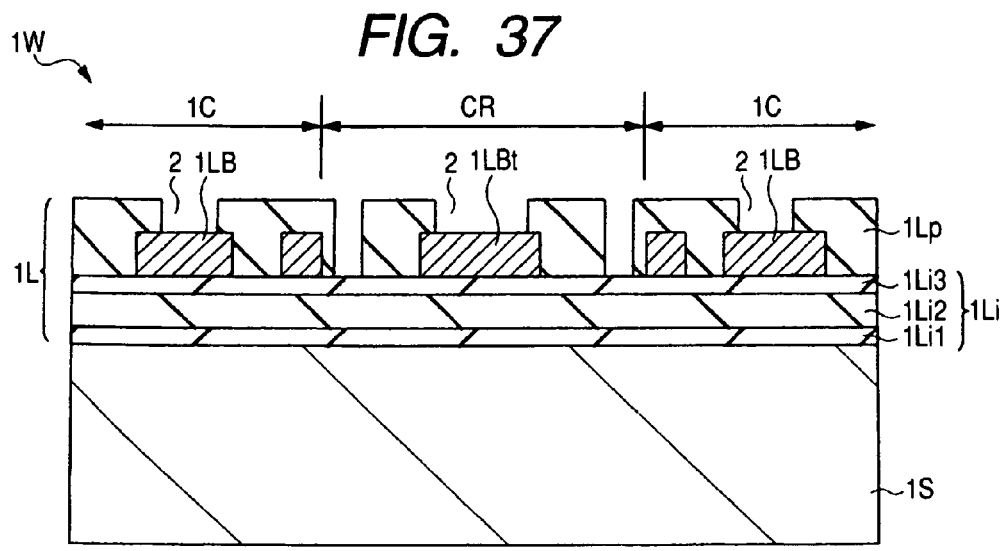
FIG. 37 is a sectional view taken along the line X6-X6 in FIG. 36.
Figure 38:
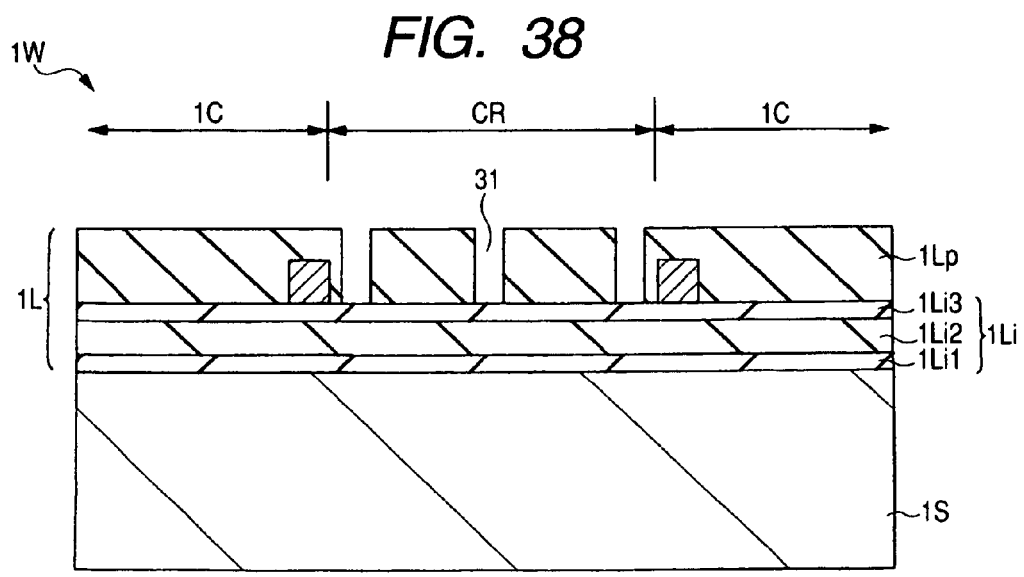
FIG. 38 is a sectional view taken along the line X7-X7 in FIG. 36.

FIG. 36 is an enlarged plan view of a characteristic part of the wafer 1W after the front-end process 100 according to the seventh embodiment; FIGS. 37 and 38 are sectional views taken along the line X6-X6 and line X7-X7 in FIG. 36, respectively. In the seventh embodiment, after the front-end process 100, the protective layer 1Lp in a cutting region CR of the main surface of the wafer 1W is partially removed along a cutting line CL and a slit 31 is made in the protective layer 1Lp.

When viewed from above, slits 31 stretch linearly along cutting lines CL with holes 2 midway. When viewed sectionally, a slit 31 stretches from the top of the protective layer 1Lp to the extent that it contacts the top of the interlayer insulating layer 1Li3 or partially gets into the interlayer insulating layer 1Li3. The slit 31 is intended to enable the protective layer 1Lp to be cut neatly in the dicing step 102B4. In the dicing step 102B4, a crack is neatly made in the protective layer 1Lp. A slit 31 is made concurrently with etching work for making holes 2, which simplifies the process. The other steps are the same as in the first to sixth embodiments. When formation of slits 31 in the protective layer 1Lp is combined with the sixth embodiment, slits 30 which partially get into the low dielectric constant layer Lk1 can be easily made.

An alternative approach to making slits 31 which contact, or partially get into, the low dielectric constant layer Lk1 of the interlayer insulating layer 1Li2, is to embed wires in slits 31 in the front-end process 100 and lastly remove all the embedded wires from the slits 31. In this case, slits 31 serve as splitting start points for the low dielectric constant layer Lk1 in the dicing step 102B4. This ensures that a crack is made neatly in the low dielectric constant layer Lk1.

The laser irradiation step for forming modified regions is the same as in the sixth embodiment. In other words, modified regions PL3 which serve as splitting start points for the substrate 1S are made in the laser irradiation step. Hence, discoloration of the low dielectric constant layer Lk1 does not occur during laser irradiation. Consequently semiconductor device yield is improved.

The invention made by the present inventors has been so far concretely explained in reference to preferred embodiments thereof. However, the invention is not limited thereto and it is obvious that it may be embodied in other various ways without departing from the spirit and scope thereof.

Although the above explanation assumes that the invention is applied to manufacture of semiconductor devices, an application field to which the invention pertains, the application field is not limited thereto but it may be applied to other various fields including manufacture of micromachines.

The invention may be applied to manufacture of semiconductor devices.

What is claimed is:

1. A semiconductor device manufacturing method comprising the steps of:
   (a) providing a semiconductor wafer having a semiconductor substrate including a main surface, a reverse surface opposing to the main surface, and a wiring layer with a low dielectric constant layer and an interlayer insulating layer formed on the main surface of the semiconductor substrate;
   wherein the interlayer insulating layer is formed on the main surface of the semiconductor substrate, and
   wherein the low dielectric constant layer is formed on the interlayer insulating layer;
   (b) forming a modified region by irradiating a laser beam to the semiconductor wafer, wherein the modified region is formed by heating and melting an inside of the semiconductor wafer; and
   (c) after the step (b), dividing the semiconductor wafer into a plurality of semiconductor chips based on the modified region,
   wherein in the step (b), the laser beam is irradiated to the semiconductor wafer such that the modified region formed by irradiating the laser beam to the semiconductor wafer contacts with a part of the low dielectric constant layer, a part of the interlayer insulating layer and a part of the semiconductor substrate.

2. The semiconductor device manufacturing method according to claim 1, wherein each of the plurality of semiconductor chips has the low dielectric constant layer, having a cutting surface; and
   wherein the modified region formed by irradiating the laser beam to the semiconductor wafer contacts with the part of the cutting surface of the low dielectric constant layer.

3. The semiconductor device manufacturing method according to claim 1, wherein the modified region is formed extending from an inside of the semiconductor substrate, in a thickness direction of the semiconductor substrate, and so as to contact with the part of the low dielectric constant layer.

4. The semiconductor device manufacturing method according to claim 1, wherein in the step (b), the semiconductor wafer is cooled.

5. The semiconductor device manufacturing method according to claim 1, wherein in the step (b), the laser beam is irradiated to the semiconductor wafer such that the modified region extends from the semiconductor substrate through the interlayer insulating layer and into the low dielectric constant layer.

6. The semiconductor device manufacturing method according to claim 5, wherein the modified region serves as a splitting start point for the low dielectric constant layer when dividing the semiconductor wafer into the plurality of semiconductor chips in step (c).

7. The semiconductor device manufacturing method according to claim 5, wherein said modified region serves as a splitting start point for both the semiconductor substrate and the low dielectric constant layer when dividing the semiconductor wafer into the plurality of semiconductor chips.

8. The semiconductor device manufacturing method according to claim 5, wherein the modified region extends a maximum of 5 micrometers into the low dielectric constant layer.

9. The semiconductor device manufacturing method according to claim 1, wherein the modified region is formed so as to have a length extending in a thickness direction of the semiconductor wafer that is greater than a width thereof extending in a direction perpendicular to said thickness direction.

* * * * *